United States Patent
Asai et al.

(10) Patent No.: US 9,093,756 B2
(45) Date of Patent: Jul. 28, 2015

(54) ANTENNA, TRANSMITTER DEVICE, RECEIVER DEVICE, THREE-DIMENSIONAL INTEGRATED CIRCUIT, AND CONTACTLESS COMMUNICATION SYSTEM

(71) Applicant: Panasonic Corporation, Osaka (JP)

(72) Inventors: Koji Asai, Osaka (JP); Takeshi Nakayama, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 40 days.

(21) Appl. No.: 14/238,311

(22) PCT Filed: Aug. 23, 2013

(86) PCT No.: PCT/JP2013/004994
§ 371 (c)(1),
(2) Date: Feb. 11, 2014

(87) PCT Pub. No.: WO2014/045518
PCT Pub. Date: Mar. 27, 2014

(65) Prior Publication Data
US 2014/0323046 A1  Oct. 30, 2014

(30) Foreign Application Priority Data

Sep. 18, 2012 (JP) ................................. 2012-204637

(51) Int. Cl.
*H01Q 7/00* (2006.01)
*H01Q 21/00* (2006.01)
(Continued)

(52) U.S. Cl.
CPC ............ *H01Q 21/00* (2013.01); *H01L 23/5227* (2013.01); *H01L 23/66* (2013.01);
(Continued)

(58) Field of Classification Search
CPC ........... H01Q 7/00; H01Q 7/005; H03D 7/14; H04B 1/18; H04B 1/04
USPC ........ 455/274, 121, 129, 193.1, 562.1, 575.7, 455/107; 343/748, 842, 866
See application file for complete search history.

(56) References Cited

U.S. PATENT DOCUMENTS 5,574,470 A * 11/1996 de Vall ........................... 343/895
6,222,452 B1 * 4/2001 Ahlstrom et al. ........... 340/572.1
(Continued)

FOREIGN PATENT DOCUMENTS

| JP | 2005-228981 | 8/2005 |
|---|---|---|
| JP | 2007-102348 | 4/2007 |

(Continued)

OTHER PUBLICATIONS

International Search Report issued Nov. 19, 2013 in International (PCT) Application No. PCT/JP2013/004994.

*Primary Examiner* — Minh D Dao
(74) *Attorney, Agent, or Firm* — Wenderoth, Lind & Ponack, L.L.P.

(57) ABSTRACT

A system including a device with a first chip and a device with a second chip, to realize contactless communication therebetween. The first chip includes a transmitter circuit converting parallel data into a differential signal and a transmitting antenna transmitting the signal to the second chip. The second chip includes a receiving antenna receiving the differential signal from the transmitting antenna and a receiver circuit converting the differential signal into the parallel data. The transmitting and receiving antenna each include at least two antenna elements, first and second terminals, and first and second junctions. The antenna elements consist of wiring lines on the chips. The terminals are connected with circuits on the chips. At the first junction, first ends of the antenna elements meet to connect to the first terminal. At the second junction, second ends of the antenna elements meet to connect to the second terminal.

15 Claims, 16 Drawing Sheets

(51) Int. Cl.
  *H01Q 1/22*    (2006.01)
  *H01L 23/522*  (2006.01)
  *H01L 23/66*   (2006.01)
  *H01L 25/065*  (2006.01)

(52) U.S. Cl.
  CPC .......... *H01L25/0657* (2013.01); *H01Q 1/2283* (2013.01); *H01Q 7/00* (2013.01); *H01L 2223/6677* (2013.01); *H01L 2224/16225* (2013.01); *H01L 2224/32145* (2013.01); *H01L 2224/73253* (2013.01); *H01L 2225/06531* (2013.01); *H01L 2924/15311* (2013.01)

(56) References Cited

U.S. PATENT DOCUMENTS

| | | | |
|---|---|---|---|
| 6,246,327 B1* | 6/2001 | Eberhardt | 340/572.1 |
| 6,412,702 B1* | 7/2002 | Ishikawa et al. | 235/492 |
| 6,651,891 B1* | 11/2003 | Zakel et al. | 235/487 |
| 6,719,206 B1* | 4/2004 | Bashan et al. | 235/492 |
| 8,276,822 B2* | 10/2012 | Kuroda | 235/487 |
| 9,019,168 B2 | 4/2015 | Kato | 343/860 |
| 2001/0011413 A1* | 8/2001 | Yamaguchi et al. | 29/600 |
| 2002/0075163 A1 | 6/2002 | Smith et al. | 340/870.16 |
| 2004/0129786 A1* | 7/2004 | Reignoux et al. | 235/492 |
| 2004/0144847 A1* | 7/2004 | Yamanaka et al. | 235/492 |
| 2005/0242959 A1* | 11/2005 | Watanabe | 340/572.7 |
| 2006/0016895 A1* | 1/2006 | Watanabe et al. | 235/492 |
| 2006/0103449 A1* | 5/2006 | Watanabe et al. | 327/512 |
| 2007/0023517 A1* | 2/2007 | Tan et al. | 235/435 |
| 2007/0069961 A1* | 3/2007 | Akiho et al. | 343/702 |
| 2007/0268143 A1* | 11/2007 | Copeland et al. | 340/572.7 |
| 2007/0289772 A1 | 12/2007 | Kuroda et al. | |
| 2008/0036687 A1* | 2/2008 | Bergman et al. | 343/895 |
| 2008/0072423 A1* | 3/2008 | Finn | 29/854 |
| 2008/0073800 A1* | 3/2008 | Finn | 257/784 |
| 2008/0224946 A1* | 9/2008 | Lee et al. | 343/895 |
| 2009/0000107 A1* | 1/2009 | Koch et al. | 29/601 |
| 2009/0027210 A1* | 1/2009 | Sakama et al. | 340/572.8 |
| 2009/0102055 A1* | 4/2009 | Aoki et al. | 257/773 |
| 2009/0121955 A1* | 5/2009 | Kubo et al. | 343/788 |
| 2009/0224058 A1* | 9/2009 | Savry | 235/492 |
| 2009/0255995 A1* | 10/2009 | Shionoiri et al. | 235/492 |
| 2010/0194645 A1* | 8/2010 | Steffen et al. | 343/700 MS |
| 2010/0277382 A1* | 11/2010 | Tanaka et al. | 343/741 |
| 2011/0023289 A1* | 2/2011 | Finn | 29/601 |
| 2011/0049249 A1* | 3/2011 | Kato et al. | 235/492 |
| 2011/0121085 A1* | 5/2011 | Matsushita et al. | 235/492 |
| 2011/0298574 A1* | 12/2011 | Sato et al. | 336/84 C |
| 2013/0008969 A1* | 1/2013 | Sakai | 235/492 |
| 2013/0026632 A1* | 1/2013 | Kikuchi et al. | 257/753 |
| 2013/0140368 A1* | 6/2013 | Hwan et al. | 235/492 |
| 2014/0209691 A1* | 7/2014 | Finn et al. | 235/492 |
| 2015/0107092 A1* | 4/2015 | Bashan et al. | 29/601 |

FOREIGN PATENT DOCUMENTS

| | | |
|---|---|---|
| JP | 2010-119067 | 5/2010 |
| JP | 2011-35733 | 2/2011 |

\* cited by examiner

ANTENNA, TRANSMITTER DEVICE, RECEIVER DEVICE, THREE-DIMENSIONAL INTEGRATED CIRCUIT, AND CONTACTLESS COMMUNICATION SYSTEM

TECHNICAL FIELD

The present invention relates to contactless communication technologies, in particular, to their application to chip-to-chip communication in three-dimensional integrated circuits.

BACKGROUND ART

Contactless communication is a technology for wireless communication with an extremely-short range of up to 10 centimeters. Contactless communication is used in, for example, communication between IC cards and automatic ticket gates, communication between IC cards or mobile phones and automatic vending machines or electric cash registers, communication between IC cards and security systems, and electric power transmission to mobile devices such as cellular phones. Technologies of applying contactless communication are more recently being developed for use in chip-to-chip communication in three-dimensional integrated circuits, in addition to keyless entry for cars, data exchange between mobile devices and personal computers, and the likes.

Three-dimensional integrated circuits mean semiconductor integrated circuits that each contain two or more chips stacked and enclosed in a single package. In order to achieve more reduced sizes, expanded functionality, enhanced speeds, and reduced power, semiconductor integrated circuits need more increased degrees of integration. Finer design rules are approaching their limits too closely to further increase the degrees of integration in two dimensions. The three-dimensional integrated circuits have been thus developed to increase the degrees of integration in three dimensions.

Among chip-to-chip communication schemes for three-dimensional integrated circuits, development of those using through silicon vias (TSVs) precedes that of the others. TSVs are conductive material, such as copper, filled in through-holes that are opened in a silicon substrate by etching. TSVs are electrically connected with wiring layers in the same chip so that, when the chip is stacked on a different chip, the TSVs are further electrically connected with wiring layers of the different chip. This enables circuits embedded in each chip to exchange signals through the TSVs with circuits embedded in another chip. Since a number of TSVs can be provided in a single chip, the chip-to-chip communication can achieve a sufficiently large bandwidth. On the other hand, TSVs have too fine structures to easily achieve a more simplified process of manufacture or a more enhanced degree of reliability.

Application of contactless communication technologies to chip-to-chip communication in three-dimensional integrated circuits is expected to enable a structure simpler than TSVs to enhance its reliability. A chip-to-chip contactless communication scheme uses coil antennas. (Refer to, e.g., Patent Literature 1.) Coil antennas are antennas with a loop element shaped by a trace or line on a substrate; they are formed on each of two chips stacked on top of another. With these chips stacked, the loop element of a coil antenna on the upper chip is placed coaxially with that of a coil antenna on the lower chip. Accordingly, induction coupling between the coil antennas causes a change in electric current amount flowing through one of them to produce an electromotive force through the other. Using this phenomenon, circuits embedded on each of the chips can exchange signals with those embedded on another.

CITATION LIST

Patent Literature

[Patent Literature 1]
  Japan Patent Publication No. 4131544

SUMMARY OF INVENTION

Technical Problem

Increased intensities of signals transmitted between coil antennas can enhance the reliability of chip-to-chip contactless communication. Such increased intensities of signals seem to be achieved if the antenna elements have at least one of the following: larger loop areas, wider lines, and a larger number of turns. However, any of these antenna elements cannot actually succeed for the following reasons: First, larger loop areas of the antenna elements prevent the chips from achieving more reduced sizes. Next, wider lines of the antenna elements need the design rules to be at least partially relaxed, and thus prevent lines from being more closely spaced, or the fabrication process from being more simplified. Furthermore, a larger number of turns of the antenna elements entail larger lengths of the lines constituting the antenna elements, and thus cause increased resistances of them. With the fabrication process under a tighter rule, these increased resistances more adversely affect the intensity of the signals transmitted between the coil antennas, and in particular prevents the signals from achieving increased intensities in a high frequency band.

An object of the present invention is to provide a contactless communication system that can maintain high intensities of signals for contactless communication in a high frequency band, thus enhancing the reliability.

Solution to Problem

An antenna according one aspect of the present invention includes at least two antenna elements, a first terminal, a second terminal, a first junction, and a second junction. The antenna elements are on a chip and each consists of a wiring line on the chip. The first and second terminals are on the chip and are connected a circuit on the chip. At the first junction, respective first ends of the antenna elements meet one another to form a single wiring line connecting to the first terminal. At the second junction, respective second ends of the antenna elements meet one another to form a single wiring line connecting to the second terminal.

A contactless communication system according to one aspect of the present invention includes a device with a first chip and a device with a second chip to realize contactless communication between the devices. The first chip includes a transmitter circuit and a transmitting antenna. The transmitter circuit converts parallel data into a differential signal. The transmitting antenna transmits the differential signal to the second chip. The second chip includes a receiving antenna and a receiver circuit. The receiving antenna receives the differential signal from the transmitting antenna. The receiver circuit converts the differential signal into the parallel data. The transmitting antenna and the receiving antenna are each configured as the antenna according to one aspect of the present invention.

Advantageous Effects of Invention

The antenna according to one aspect of the present invention includes the at least two antenna elements connecting the first and second junctions. Even when each of the antenna elements consists of a wiring line of severely reduced width, the resistance between the two junctions can be reduced to a sufficiently low level. While the resistance is maintained at a low level, the antenna elements are allowed to have sufficiently large lengths. As a result, the contactless communication system according to one aspect of the present invention can maintain high intensities of the signals in a high frequency band, thus enhancing the reliability.

DESCRIPTION OF EMBODIMENTS

The following describes embodiments of the present invention with reference to the drawings.

Embodiment 1

Figure 1:
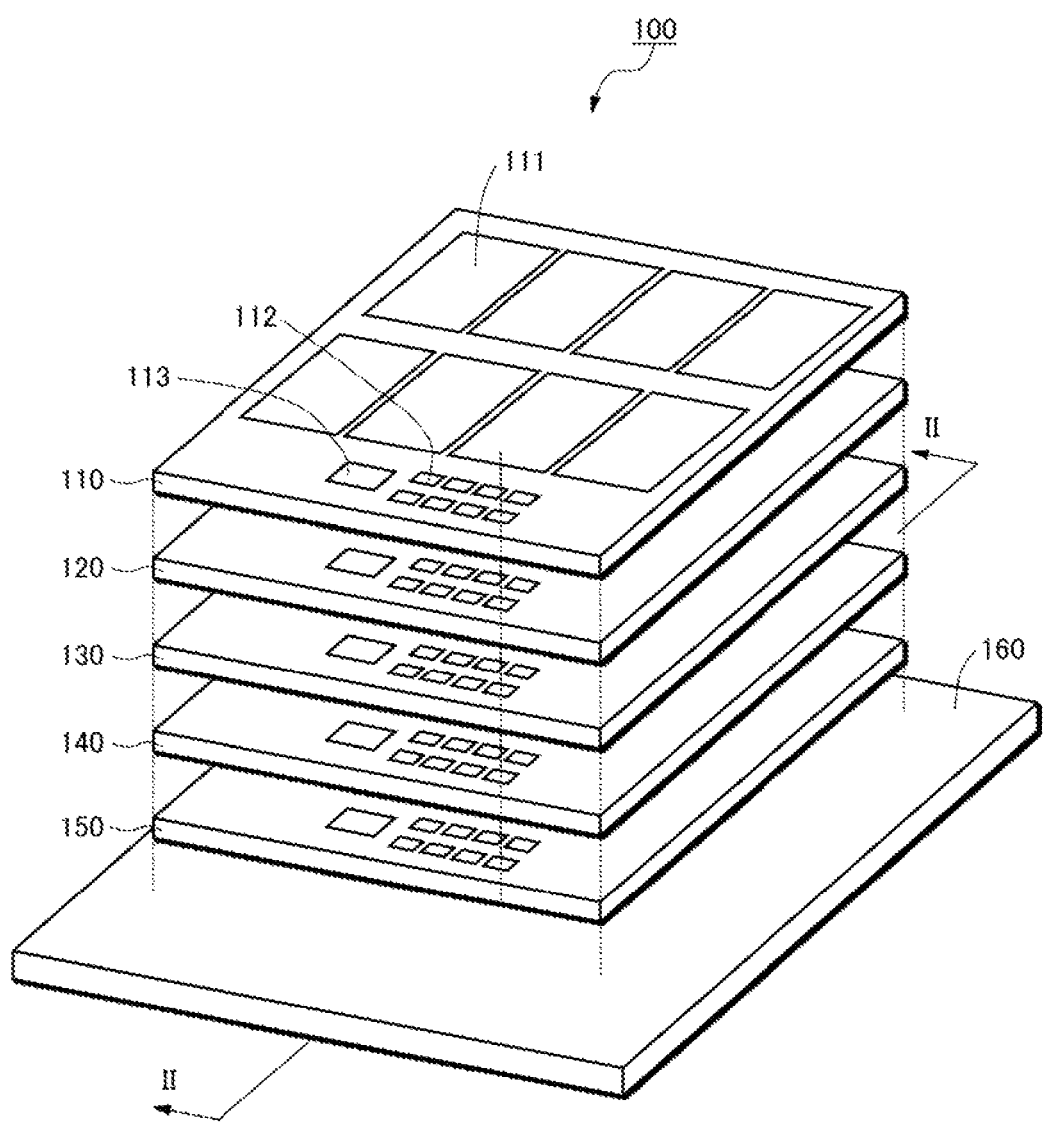
FIG. 1 is an exploded view showing the structure of a three-dimensional integrated circuit according to Embodiment 1 of the present invention.

FIG. 1 is an exploded view showing the structure of a three-dimensional integrated circuit according to Embodiment 1 of the present invention. Referring to FIG. 1, this integrated circuit 100 includes a plurality of chips 110, 120, 130, 140, 150, and an interposer 160. These chips 110-150 are stacked one on top of another, and the lowest of them is on the interposer 160. Each of the chips 110, . . . , 150 includes two or more core circuits 111, two or more antenna areas 112, and a communication circuit 113. These components 111, 112, 113 are covered with a wiring layer not shown in FIG. 1, and connected with each other through the wiring layer. The core circuits 111 each realize functions of a CPU, memory array, digital signal processor (DSP), programmable logic device (PLD), random logic circuit, or the like. The antenna areas 112 are arranged in a lattice structure and each include a single coil antenna. The coil antennas are connected to the communication circuit 113. When the chips 110-150 are stacked one on top of another, each of the antenna areas 112 on one of the chips is located straight above or below one of the antenna areas on a different one of the chips. Under this condition, each of the coil antennas on one of the chips is arranged coaxially with one of the coil antennas on a different one of the chips. The communication circuit 113 is electrically connected with the core circuits 111 on the same chip. The communication circuit 113 receives parallel data from any of the core circuits 111, converts the data into a differential signal, and transmits the signal to one of the antenna areas 112. Conversely, the communication circuit 113 receives from one of the antenna areas 112 a differential signal caught by a coil antenna included in the area, converts the signal into parallel data, and transmits the data to one of the core circuits 111.

Figure 2:
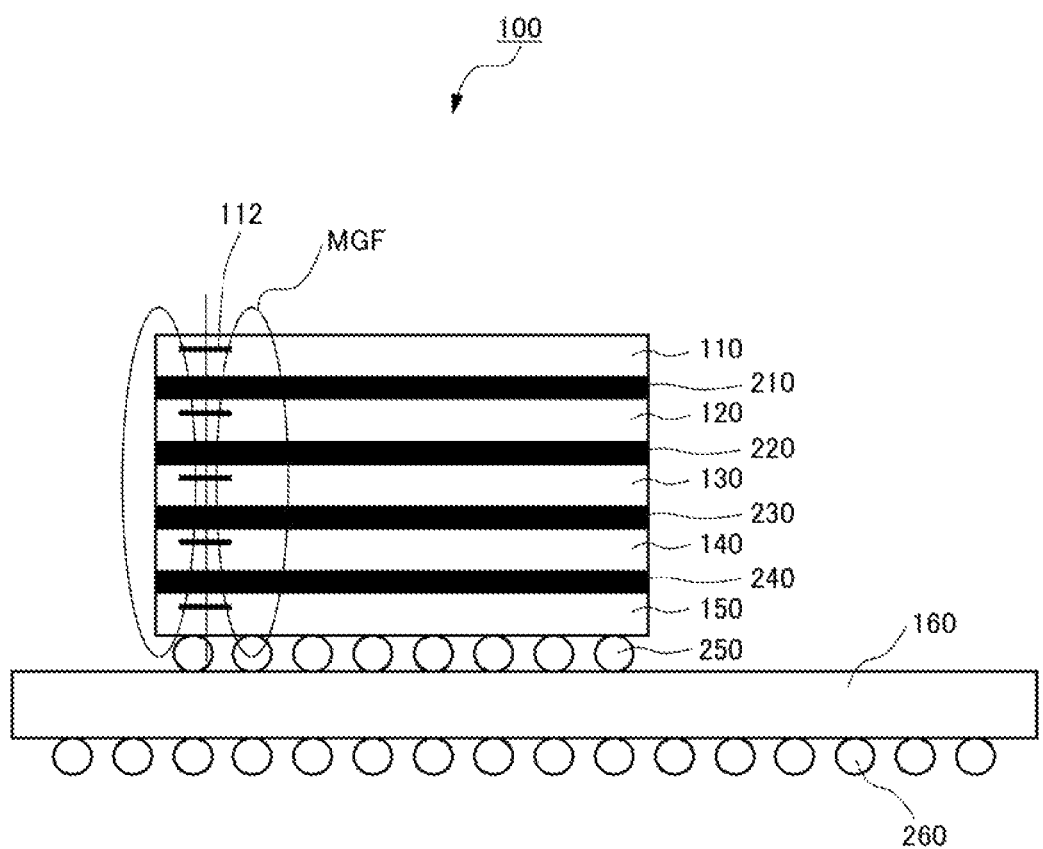
FIG. 2 is a schematic view showing a cross section taken along lines II-II shown in FIG. 1.

FIG. 2 is a schematic view showing a cross section taken along lines II-II shown in FIG. 1. Referring to FIG. 2, adhesive layers 210, 220, 230, 240 are filled between the chips 110, 120, . . . , 150 to bond them together. The antenna areas 112 on each of the chips 110, . . . , 150 are each located straight above or below one of the antenna areas on a different one of the chips. When electric current flows through a coil antenna on one of the antenna areas 112, resulting magnetic fluxes MGF penetrate the coil antennas in different antenna areas positioned straight above and below the one of the antenna areas 112. As a result, inductive coupling is produced between the coil antennas. More concretely, a change in current through any of the coil antennas entails a change in magnetic flux, thus generating an electromotive force in other ones of the coil antennas. Using the coil antennas thus enables chip-to-chip communication. Microbumps 250 connect the lowest chip 150 and the interposer 160, and bumps 260 connect the interposer 160 and external terminals (not shown in FIG. 2.)

In general, an antenna has a typical size substantially equal to the communication distance of the antenna. Since the distance for chip-to-chip communication is determined from the thicknesses of the chips 110, . . . , 150 and the gaps therebetween, i.e., the thicknesses of the adhesive layers 210, . . . , 240, the sizes of the coil antennas vary with the fabrication processes and stacking methods of the chips. For example, when the chips are one hundred and several tens of micrometers in thickness and are spaced several tens of micrometers away from one another, the coil antennas are each designed to occupy an area of several square micrometers to several square millimeters in one of the antenna areas 112.

Figure 3:
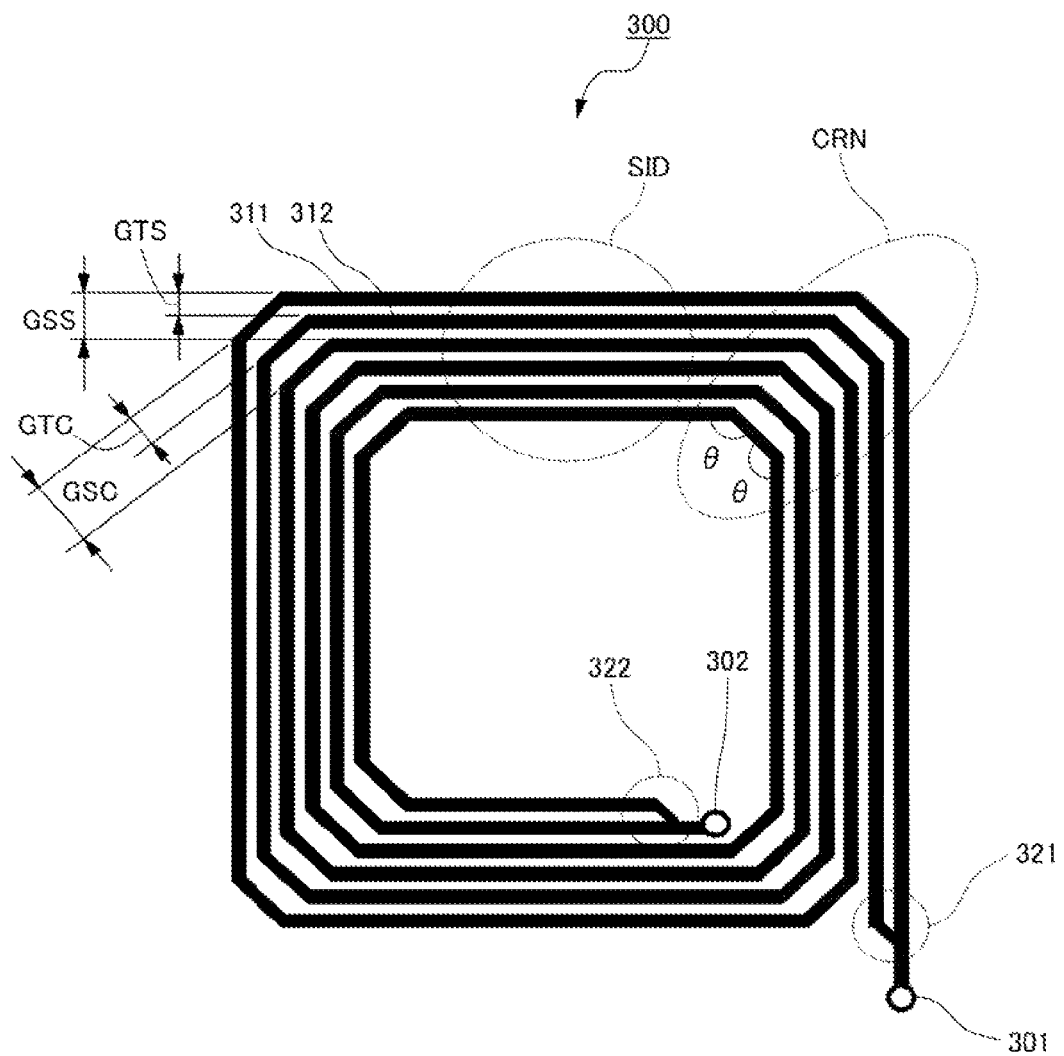
FIG. 3 is a plan view of a coil antenna included in one of antenna areas shown in FIG. 1.

FIG. 3 is a plan view of a coil antenna included in one of the antenna areas shown in FIG. 1. This coil antenna 300 is used to transmit signals from the communication circuit 113 on the same chip to another chip. Referring to FIG. 3, this coil antenna 300 includes a first terminal 301, a second terminal 302, a first antenna element 311, a second antenna element 312, a first junction 321, and a second junction 322. The first and second terminals 301, 302 are connected to the communication circuit 113 on the same chip, and receive differential signals from the communication circuit 113. Signal voltages that the first terminal 301 receives have opposite phases to those that the second terminal 302 does. The first antenna element 311, the second antenna element 312, the first junction 321, and the second junction 322 each consist of a wiring line on a chip. The wiring lines have a constant width fixed by a design rule. The first and second antenna elements 311, 312 are concentric loops. Portions of the second antenna element 312 run in parallel with, and are located to the inside of corresponding portions of the first antenna element 311. Each of the loops is substantially rectangular and is a spiral having three inward, counterclockwise turns. At each corner CRN of the spirals formed by the antenna elements 311, 312, the wiring lines bend at an internal angle θ larger than 90 degrees. The turns of the spiral formed by the first antenna element 311 are spaced a constant distance GSC apart from each other at each corner CRN, and another constant distance GSS apart from each other along each edge SID. The distance GSC at each corner CRN is larger than the distance GSS along each edge SID. These distances GSC, GSS are twice as large as the distances GTC, GTS, respectively, between the first and second antenna elements 311, 312. Each turn of the spiral formed by the second antenna element 312 is thus located at the same distance from two adjacent turns of the spiral formed by the first antenna element 311. At the first junction 321, respective first ends of the first and second antenna elements 311, 312 meet one another to form a single wiring line connecting to the first terminal 301. At the second junction 322, respective second ends of the first and second antenna elements 311, 312 meet one another to form a single wiring line connecting to the second terminal 302. Between the first and second terminals 301, 302, electric currents caused by the differential signals separately flow through the two antenna elements 311, 312.

The angle θ of the bent lines at each corner CRN of the spirals is larger than 90 degrees, for example, equal to 135 degrees. At the junctions 321, 322, the end portions of the second antenna element 312 meet the end portions of the second antenna element 312 at an oblique angle, e.g., at an angle of 45 degrees. Thus, electric currents flowing through the antenna elements 311, 312 are disturbed by reflection only to a small extent at any of the four corners CRN of the spirals and the two junctions 321, 322. This suppresses signal losses in a high frequency band in the order of gigahertz, especially in a high frequency band of 10 GHz or higher, and thus enables the coil antenna 300 to achieve a sufficiently high gain in the high frequency band. In addition, appropriate adjustment of the angle at which the end portions of the second antenna element 312 meets the end portions of the first antenna element 311 at the first and second junctions 321, 322 allows the two antenna elements 311, 312 to have substantially equal total lengths. Due to the above, the larger number of turns the antenna elements 311, 312 have, (those shown in FIG. 3 each have "3" turns) the higher inductance the coil antenna 300 has. On the other hand, the resistance of the coil antenna 300 is substantially equal to half of the resistance of each of the antenna elements 311, 312.

Figure 4:
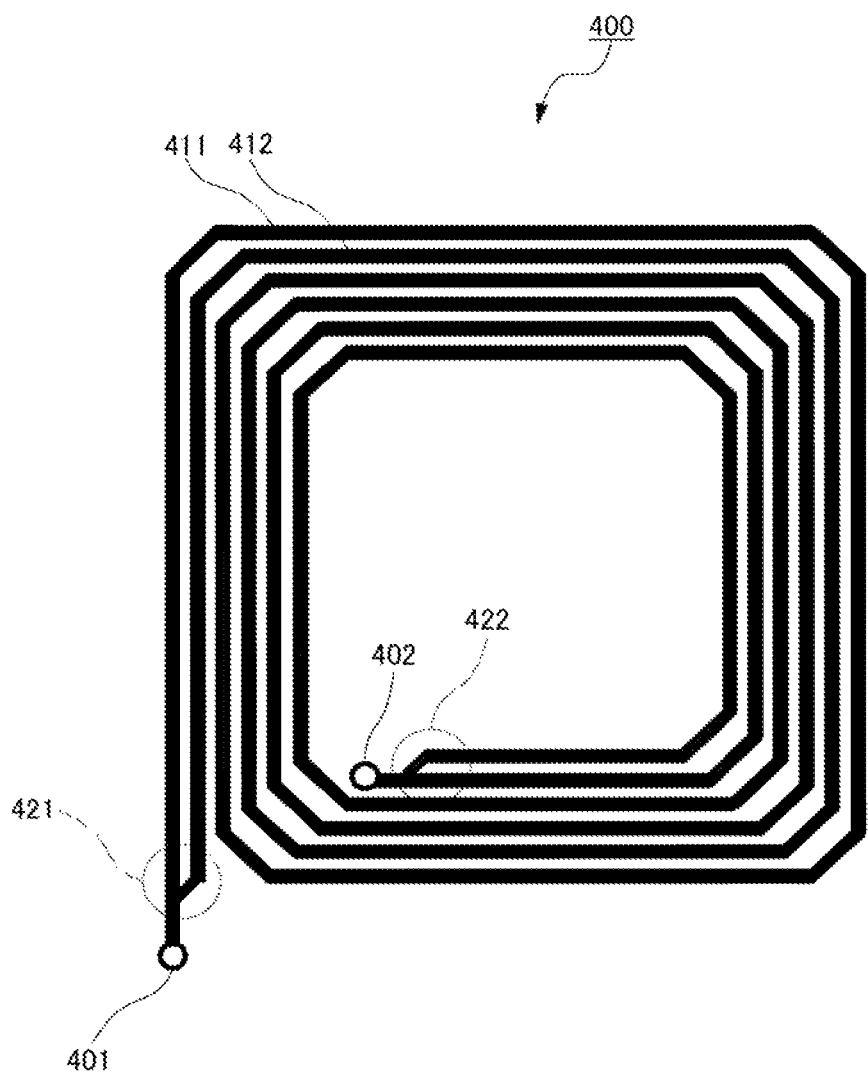
FIG. 4 is a plan view of a coil antenna located straight above or below the coil antenna shown in FIG. 3.

FIG. 4 is a plan view of a coil antenna located straight above or below the coil antenna shown in FIG. 3. This coil antenna 400 is used for receiving signals from the coil antenna 300 shown in FIG. 3. As is clear from the comparison of FIGS. 3 and 4, the shape of the coil antenna 400 is a mirror image of the shape of the coil antenna 300 shown in FIG. 3. More concretely, this coil antenna 400, like that 300 shown in FIG. 3, includes a first terminal 401, a second terminal 402, a first antenna element 411, a second antenna element 412, a first junction 421, and a second junction 422. The first antenna element 411, the second antenna element 412, the first junction 421, and the second junction 422 each consist of a wiring line on a chip. Each of the first and second antenna elements 411, 412, like the first and second antenna elements 311, 312 shown in FIG. 3, is a substantially rectangular spiral. However, differing from the first and second antenna elements 311, 312 shown in FIG. 3, the spirals formed by the first and second antenna elements 411, 412 have inward, clockwise turns. At the first junction 421, respective first ends of the first and second antenna elements 411, 412 meet one another to form a single wiring line connecting to the first terminal 401. At the second junction 422, respective second ends of the first and second antenna elements 411, 412 meet one another to form a single wiring line connecting to the second terminal 402. The first and second terminals 401, 402 are connected to the communication circuit 113 on the same chip. Through these terminals 401 and 402, the communication circuit 113 detects differential signals from the coil antenna 300, which are caught by the two antenna elements 411, 412.

Figure 5:
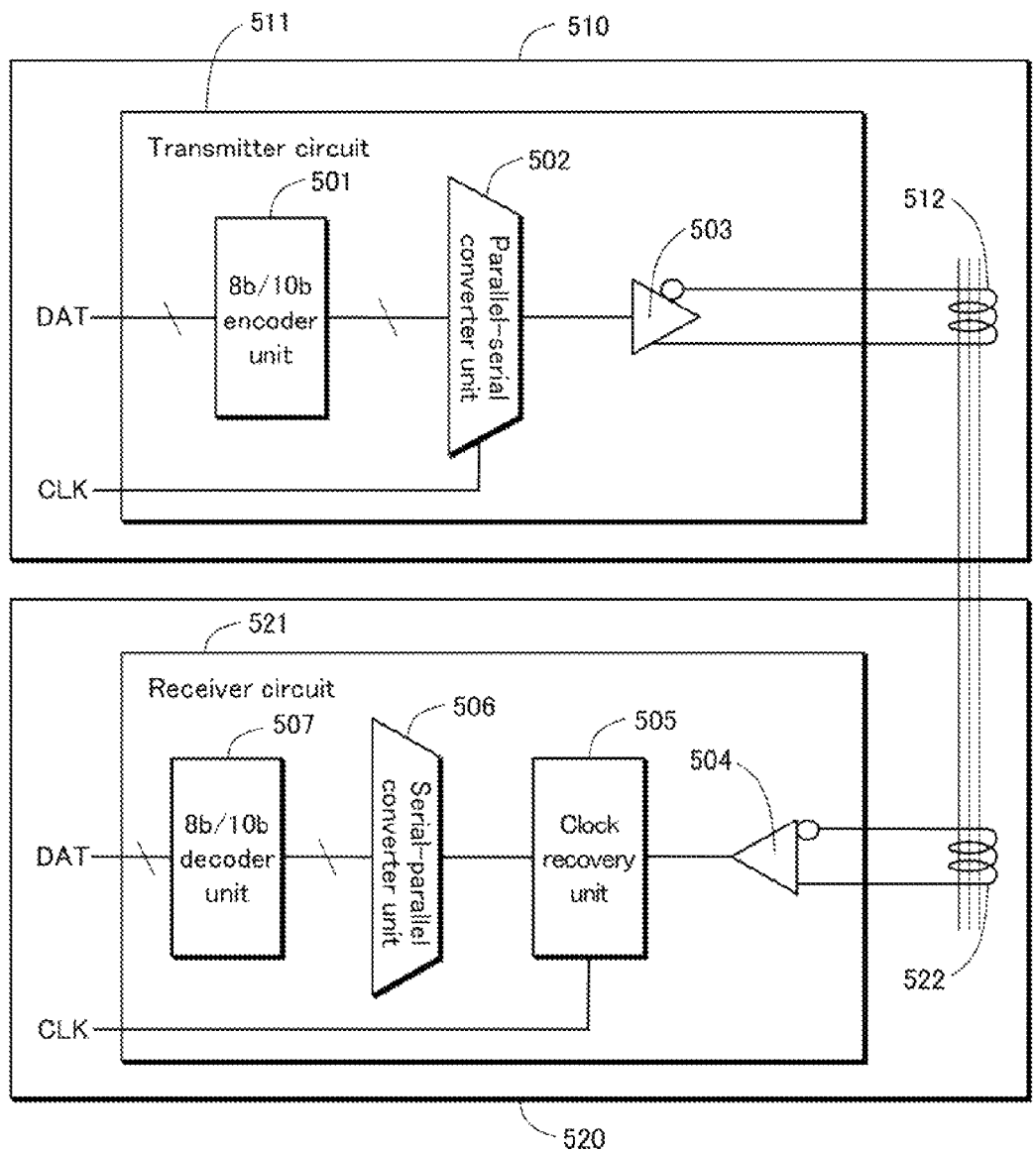
FIG. 5 is a block diagram showing components used for communication on the chip shown in FIG. 1.

FIG. 5 is a block diagram showing components used for communication on the chip shown in FIG. 1. Referring to FIG. 5, a first chip 510 and a second chip 520 are two of the chips 110-150 shown in FIG. 1. The first chip 510 includes a transmitter circuit 511 and a transmitting antenna 512. The transmitter circuit 511 is included in the communication circuit 113 on the first chip 510. The transmitting antenna 512 is a coil antenna 300 included in one of the antenna areas 112 on the first chip 510. The second chip 520 includes a receiver circuit 521 and a receiving antenna 522. The receiver circuit 521 is included in the communication circuit 113 on the second chip 520. The receiving antenna 522 is a coil antenna 400 included in, among the antenna areas 112 on the second chip 520, one that is located straight above or below the above-described one of the antenna areas 112 on the first chip 510.

Referring further to FIG. 5, the transmitter circuit 511 includes an 8b/10b encoder unit 501, a parallel-serial converter unit 502, and a transmitting buffer 503; the receiver circuit 521 includes a receiving buffer 504, a clock recovery unit 505, a serial-parallel converter unit 506, and an 8b/10b decoder unit 507. The 8b/10b encoder unit 501 receives 8-bit parallel data DAT from a source core circuit 111, and converts the data DAT into 10-bit parallel data. The parallel-serial converter unit 502 converts the 10-bit parallel data into serial data. The serial data is sent bit by bit in synchronization with a certain clock signal CLK. The transmitting buffer 503 changes the voltage of a differential signal according to the serial data. The differential signal is sent to the transmitting antenna 512. This changes electric current flowing through the transmitting antenna 512, and accordingly changes magnetic fluxes MGF penetrating the transmitting and receiving antennas 512, 522, thus producing an electromotive force in the receiving antenna 522. The receiving buffer 504 amplifies changes in the electromotive force as changes in voltage of a differential signal to be transmitted to the clock recovery unit 505. The clock recovery unit 505 shapes the voltage changes into serial data, and in addition, recovers the clock signal CLK from the voltage changes. The serial-parallel converter unit 506 converts the serial data into 10-bit parallel data. The 8b/10b decoder unit 507 decodes the 10-bit parallel data into the 8-bit one DAT, and then sends it to a destination core circuit 111. In this manner, the 8-bit parallel data DAT is transmitted from the core circuit on the first chip 510 to that on the second chip 520.

Merits of Embodiment 1

Figure 6:
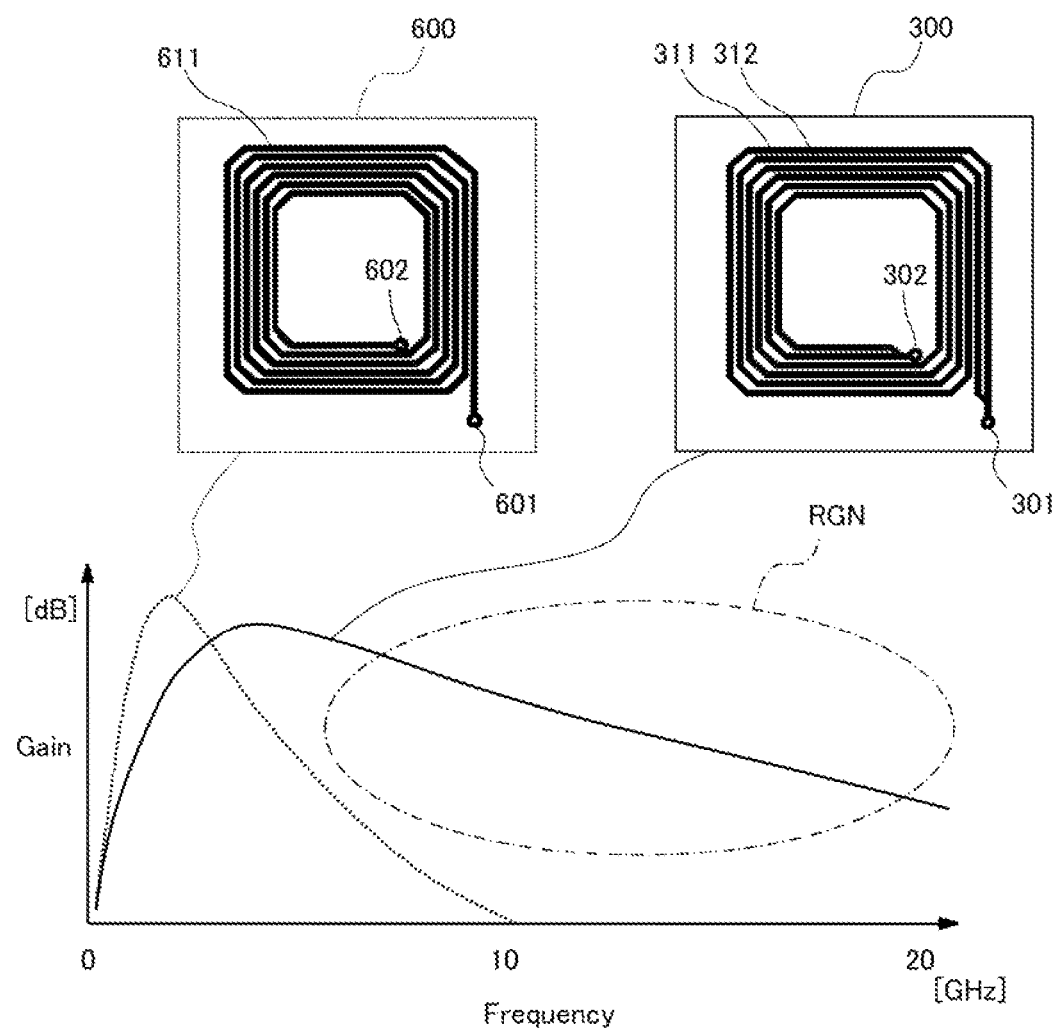
FIG. 6 includes plan views of a coil antenna including only one antenna element and the coil antenna shown in FIG. 3 and gain-frequency characteristic graphs of the coil antenna including only one antenna element and the coil antenna shown in FIG. 3.

FIG. 6 includes plan views of a coil antenna including only one antenna element (hereinafter referred to as a "first coil antenna") and the coil antenna shown in FIG. 3 (hereinafter referred to as a "second coil antenna"), and gain-frequency characteristic graphs of the first and second coil antennas. Referring to FIG. 6, the first coil antenna 600 includes a first terminal 601, a second terminal 602, and a single antenna element 611. The first and second terminals 601, 602 receive a differential signal from the communication circuit 113 on the same chip. The antenna element 611, like the two elements 311, 312 shown in FIG. 3, consists of a wiring line on the chip, and is a substantially rectangular spiral. The first and second coil antennas 600, 300 are similar to each other such that: the wiring lines composing the first and second coil antennas 600, 300 have the same width; the distance between turns of the wiring line composing the first coil antenna 600 is the same as the distance between the wiring lines composing the second coil antenna 300; and the spirals formed by the first and second coil antennas 600, 300 have the same size. On the other hand, the antenna element 611 of the first coil antenna 600 has twice as many turns (equal to 6) as each of the antenna elements 311, 312 of the second coil antenna 300. As a result, the area and the number of turns of the first coil antenna 600 is the same as the area and the total number of turns of the second coil antenna 300, but the wiring line extending from the first terminal to the second terminal in the first coil antenna 600 has substantially twice the length of each wiring line extending from the first terminal to the second terminal in the second coil antenna 300. Accordingly, the first coil antenna 600 has the same inductance as the second coil antenna 300, but substantially four times as much resistance. This differentiates the second coil antenna 300 from the first coil antenna 600 in terms of gain-frequency characteristics. The dashed-line graph and the solid-line graph shown in FIG. 6 represent gain-frequency characteristics of the first and second coil antennas 600, 300, respectively. As is clear from these graphs, the second coil antenna 300 achieves sufficiently high gains in a high frequency band in the order of gigahertz, especially in a high frequency band of 10 GHz or higher, in contrast to the first coil antenna 600. (See the region RGN surrounded by the dashed-dotted lines in FIG. 6.)

As described above, the three-dimensional integrated circuit according to Embodiment 1 of the present invention has the coil antenna used for chip-to-chip contactless communication, which includes the two antenna elements 311, 312. These elements 311, 312 connect the first junction 321 to the second one 322, and form parallel, concentric spirals. This enables the coil antenna 300, even though its wiring lines have a constant width limited by a design rule, to achieve a sufficiently low resistance while maintaining a high inductance. As a result, the three-dimensional integrated circuit according to Embodiment 1 of the present invention can maintain high intensities of signals for chip-to-chip contactless communication in a high frequency band in the order of gigahertz, especially in a high frequency band of 10 GHz or higher, thus enhancing the reliability.

Modifications (A) The coil antenna 300 shown in FIG. 3 is used for transmitting signals, and the coil antenna 400 shown in FIG. 4 is for receiving signals. Conversely, the coil antenna 300 may be used for receiving signals, and the coil antenna 400 may be used for transmitting signals. Alternatively, one or both of the coil antennas 300, 400 may be bidirectional. The number of turns of the coil antennas does not need to be limited to the value "3" shown in FIGS. 3, 4, but may be any integer of 1 or more, or any half-integer. The transmitting and receiving antennas may be spirals having turns in the same direction, in contrast to those shown in FIGS. 3, 4. The shape of the transmitting antenna may not be a mirror image of the shape of the receiving antenna, in contrast to those shown in FIGS. 3, 4, and one of the transmitting and receiving antennas may have a larger size than the other.

(B) In FIG. 5, the number of chips on a transmitter side is equal to the number of chips on a receiver side; more specifically, only one chip is provided to each of the transmitter side and the receiver side. Alternatively, one of or both of the transmitter side and the receiver side may have two or more chips. Regardless of the relation between the number of chips provided on the transmitter side and the number of chips provided on the receiver side, chips on the transmitter and receiver sides communicate with each other through coaxially-arranged coil antennas.

Figure 7:
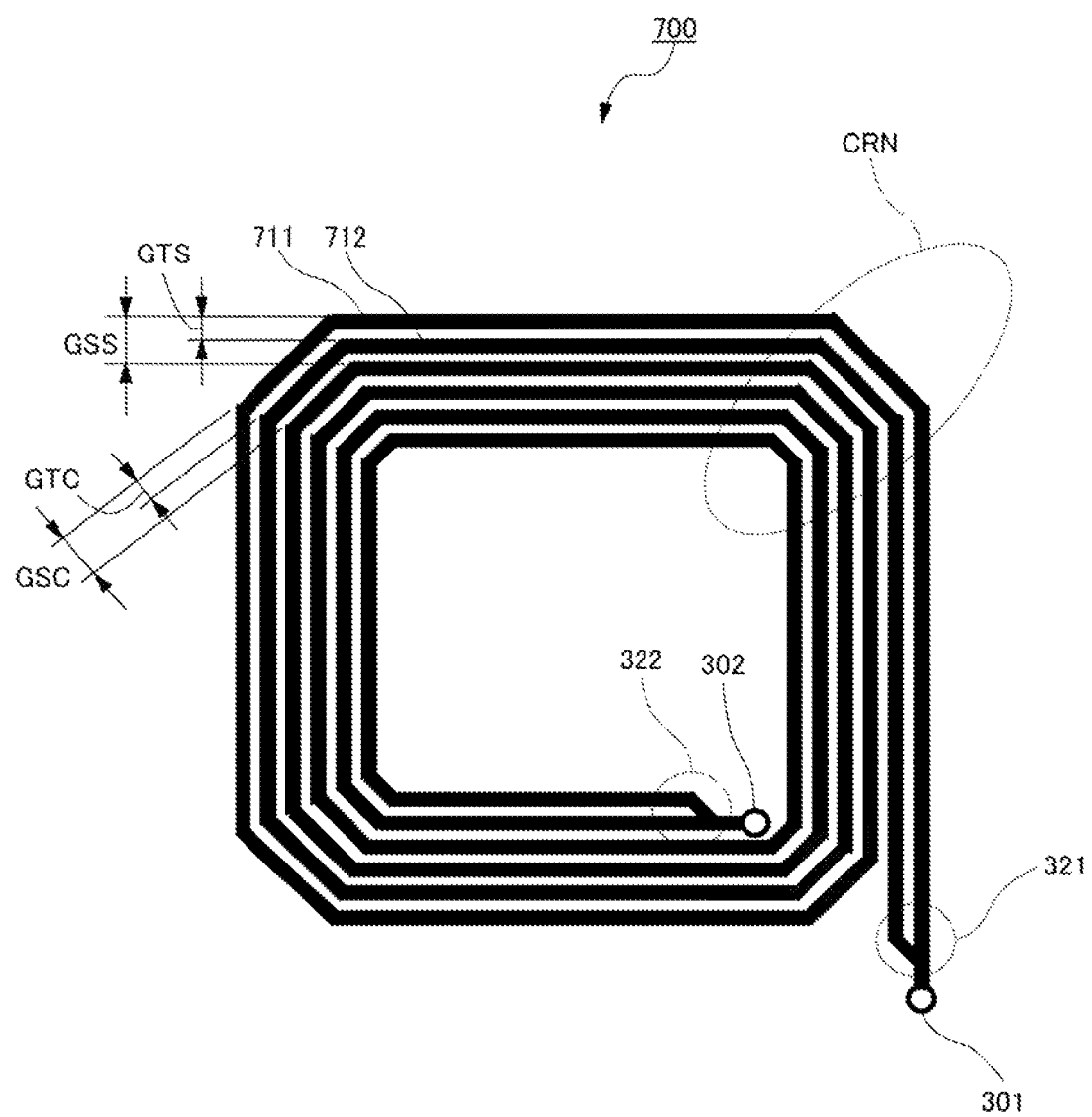
FIG. 7 is a plan view of modification 1 of the coil antenna.

(C) FIG. 7 is a plan view of modification 1 of the coil antenna pertaining to Embodiment 1. Referring to FIG. 7, this coil antenna 700 differs from the coil antenna 300 shown in FIG. 3 in that loops formed by first and second antenna elements 711, 712 have different shapes to the loops formed by the first and second antenna elements 311, 312. Other features of the coil antenna 700 are similar to those of the coil antenna 300 shown in FIG. 3. The first and second antenna elements 711, 712 are concentric loops. Portions of the second antenna element 712 run in parallel with, and are located to the inside of corresponding portions of the first antenna element 711. Each of the loops is a substantially rectangular spiral having three inward, counterclockwise turns. The first antenna element 711 is an evenly-spaced spiral, with a plurality of turns at a constant distance from one another, in contrast to the antenna elements 311, 312 shown in FIG. 3. More concretely, the distance GSC between adjacent turns of the spiral at each corner CRN is equal to the distance GSS between adjacent turns along each edge SID. The first and second antenna elements 711, 712 are evenly spaced, with a constant distance GTC=GTS therebetween. The distance GTC=GTS is half of the distance GSC=GSS between adjacent turns of the spiral formed by the first antenna element 711. Since the distance between wiring lines is constant throughout the antenna elements 711, 712, magnetic fields caused by electric currents flowing through the wiring lines are disturbed only to a small extent at any of the four corners CRN of the spirals. This suppresses signal losses, and thus enables the coil antenna 700 to achieve a sufficiently high gain.

Figure 8:
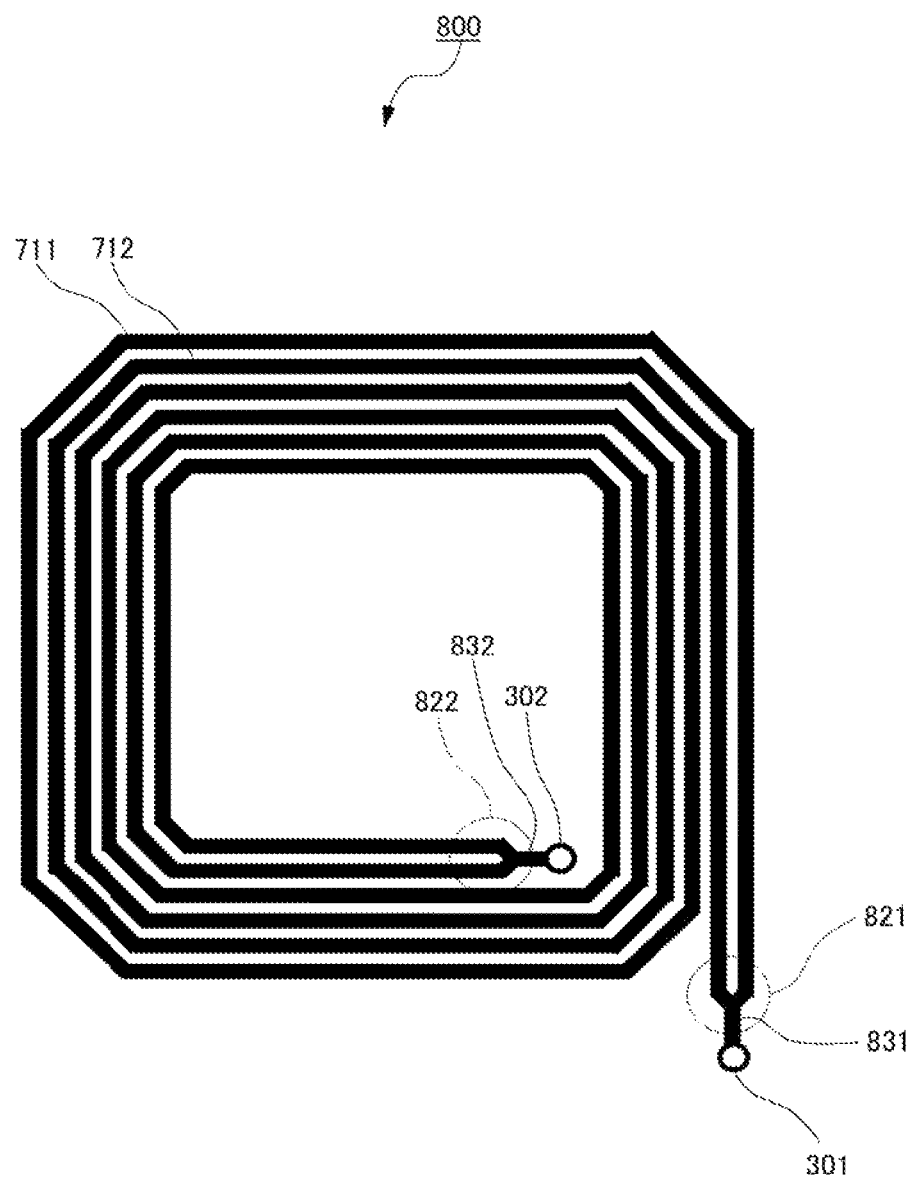
FIG. 8 is a plan view of modification 2 of the coil antenna.

(D) FIG. 8 is a plan view of modification 2 of the coil antenna pertaining to Embodiment 1. Referring to FIG. 8, this coil antenna 800 differs from the coil antenna 700 shown in FIG. 7 in that the shapes of first and second junctions 821, 822 differ from the shapes of the first and second junctions 321, 322. Other features of the coil antenna 800 are similar to those of the coil antenna 700 shown in FIG. 7. Referring to FIG. 8, at each of the first and second junctions 821, 822, end portions of the first and second antenna elements 711, 712 meet a corresponding one of common wiring lines 831, 832. In specific, at each of the first and second junctions 821, 822, the end portions of the first and second antenna elements each meet one end of the corresponding one of the common wiring lines 831, 832 at an oblique angle, e.g., at an angle of 45 degrees. In this way, the junctions 821, 822 differ from the junctions 321, 322 shown in FIG. 3. The other ends of the common wiring lines 831, 832 are connected to different terminals 301, 302, respectively. Electric currents flowing through the antenna elements 711, 712 are disturbed by reflection only to a small extent at the junctions 821, 822, which is similar to the situation at the junctions 321, 322 shown in FIG. 7. This suppresses signal losses, and thus enables the coil antenna 800 to achieve a sufficiently high gain.

Figure 9:
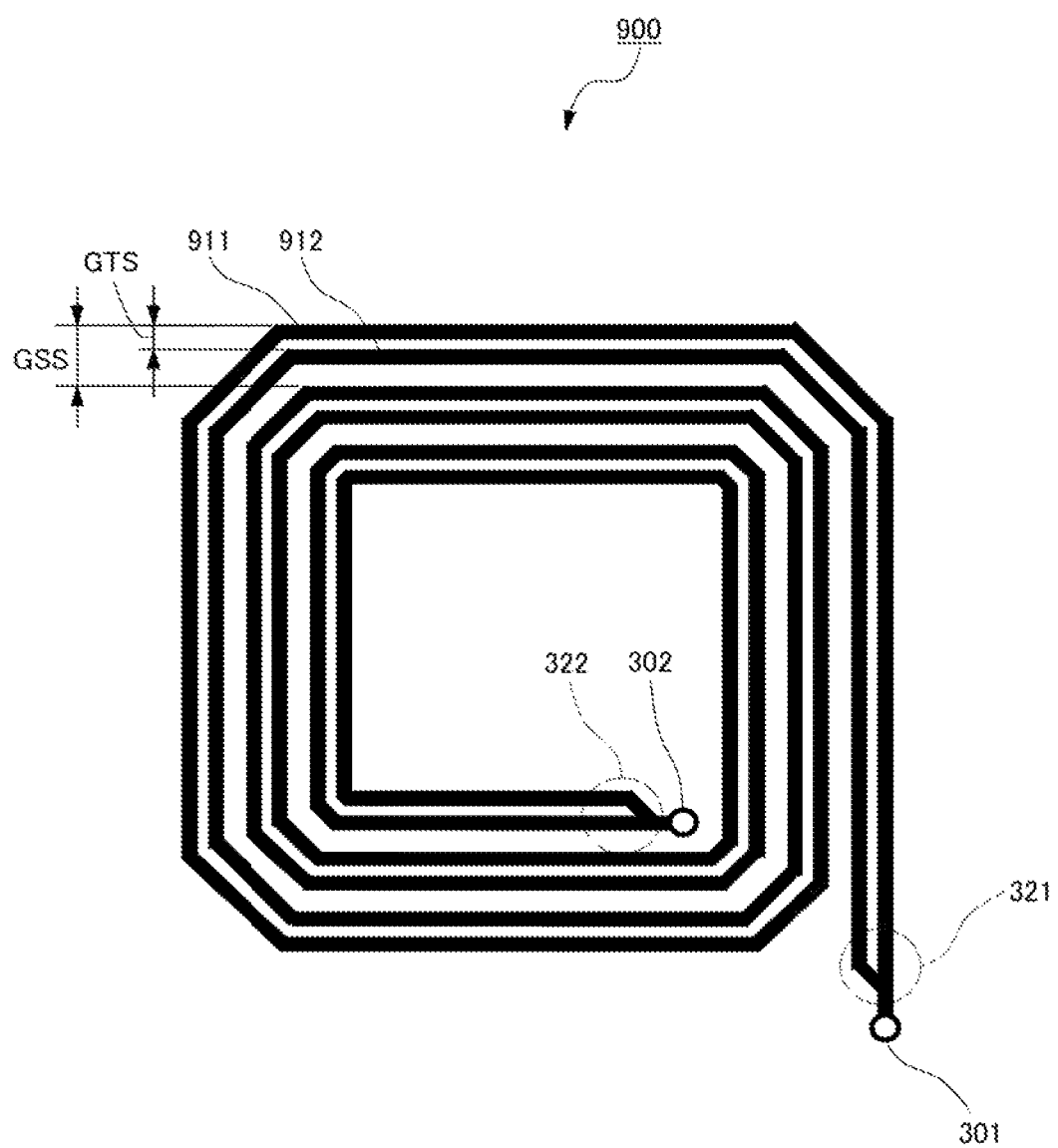
FIG. 9 is a plan view of modification 3 of the coil antenna.

(E) FIG. 9 is a plan view of modification 3 of the coil antenna pertaining to Embodiment 1. Referring to FIG. 9, this coil antenna 900 differs from the coil antenna 300 shown in FIG. 3 in that loops formed by first and second antenna elements 911, 912 have different shapes to the loops formed by the first and second antenna elements 311, 312. Other features of the coil antenna 900 are similar to those of the coil antenna 300 shown in FIG. 3. The first and second antenna elements 911, 912 are concentric loops. Portions of the second antenna element 912 run in parallel with, and are located to the inside of corresponding portions of the first antenna element 911. Each of the loops is a substantially rectangular spiral having three inward, counterclockwise turns. Like the antenna elements 711, 712 shown in FIG. 7, the first antenna element 911 is an evenly-spaced spiral, with a plurality of turns at a constant distance from one another, and the first and second antenna elements 911, 912 are evenly spaced, with a constant distance therebetween. In contrast to the first and second antenna elements 711, 712 shown in FIG. 7, the constant distance GTS between the first and second antenna elements 911, 912 is smaller than half of the distance GSS between adjacent turns of the spiral formed by the first antenna element 911. An electric current flowing at a given portion of the first antenna element 911 thus strongly interacts with an electric current flowing at a corresponding portion of the second antenna element 912, which is one located closer to the center of the coil antenna 900 among portions of the second antenna element 912 that are adjacent to the given portion, but is insusceptible to electric currents flowing at other portions of the first and second antenna elements 911, 912. This suppresses signal distortions, and thus enables the coil antenna 900 to achieve sufficiently high performances.

Figure 10:
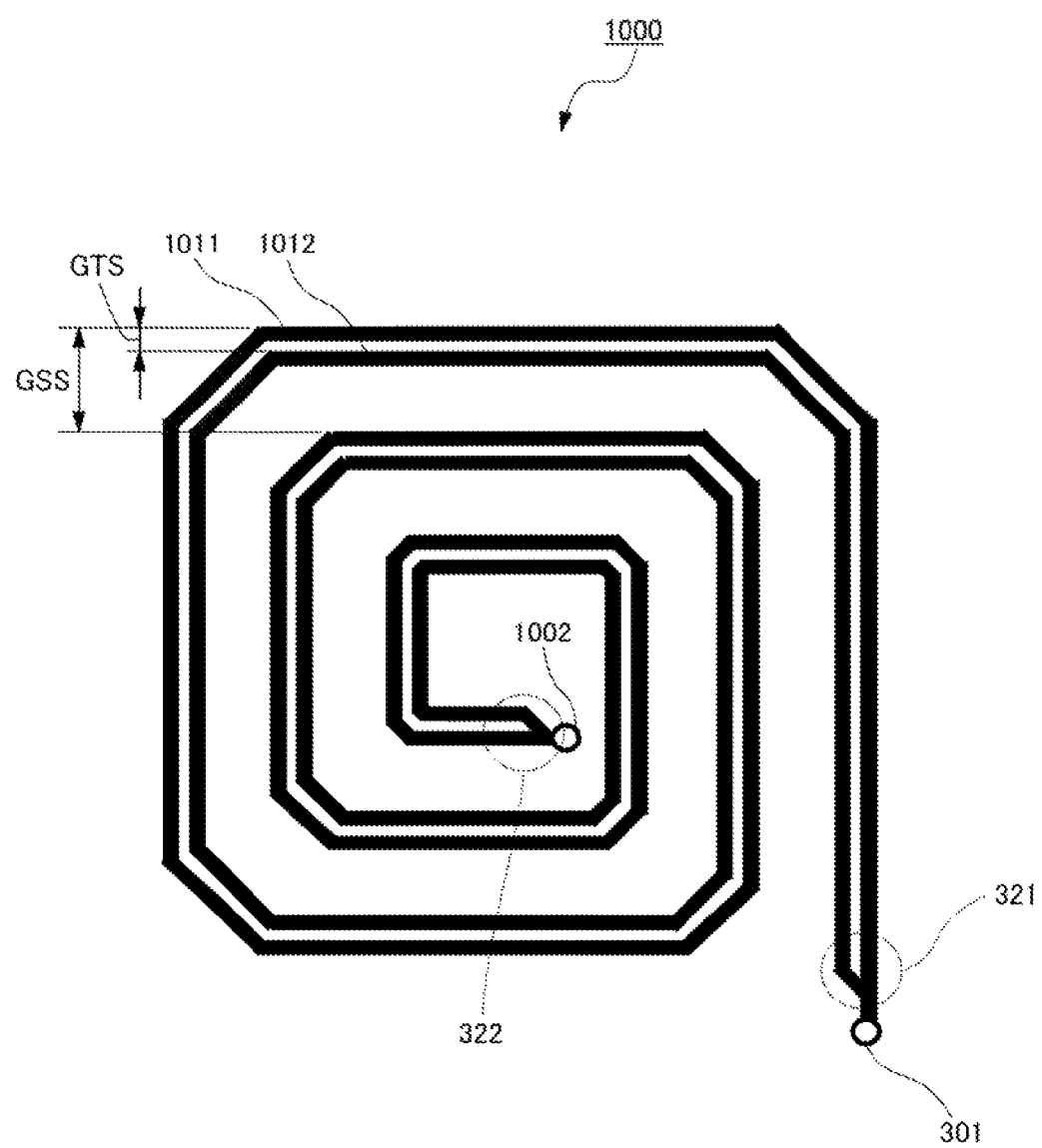
FIG. 10 is a plan view of modification 4 of the coil antenna.

(F) FIG. 10 is a plan view of modification 4 of the coil antenna pertaining to Embodiment 1. Referring to FIG. 10, this coil antenna 1000 has the second terminal 1002. The second terminal is located closer to the center of the coil antenna in the coil antenna 1000 than in the coil antenna 900 shown in FIG. 9. Other features of the coil antenna 1000 are similar to those of the coil antenna 900 shown in FIG. 9. In particular, each of the first and second antenna elements 1011, 1012, like the first and second antenna elements 911, 912 shown in FIG. 9, is a substantially rectangular spiral having three inward, counterclockwise turns. Furthermore, the first antenna element 1011 is an evenly-spaced spiral, with a plurality of turns at a constant distance from one another, and the first and second antenna elements 1011, 1012 are evenly spaced, with a constant distance therebetween. In contrast to the first and second antenna elements 911, 912 shown in FIG. 9, the constant distance GTS between the first and second antenna elements 1011, 1012 is extremely smaller than the distance GSS between adjacent turns of the spiral formed by the first antenna element 1011. An electric current flowing at a given portion of the first antenna element 1011 thus strongly interacts with an electric current flowing at a corresponding portion of the second antenna element 1012, which is one located closer to the center of the coil antenna 1000 among portions of the second antenna element 1012 that are adjacent to the given portion, but is hardly affected by electric currents flowing at other portions of the first and second antenna elements 1011, 1012. This suppresses signal distortions, and thus enables the coil antenna 1000 to achieve sufficiently high performances. In addition, the uniform magnetic fields generated by the coil antenna 1100 disposed on a chip covers a larger region than the uniform magnetic fields generated by the coil antenna 900 shown in FIG. 9. This makes it easier to adjust, with respect to the chip in which the coil antenna 1000 is disposed, the location of a chip different from the chip on which the coil antenna 1000 is disposed to allow the magnetic fields of the coil antenna 1000 to penetrate another coil antenna on the different chip. In this sense, the coil antenna 1000 shown in FIG. 10 easily establishes induction coupling with another coil antenna.

Figure 11:
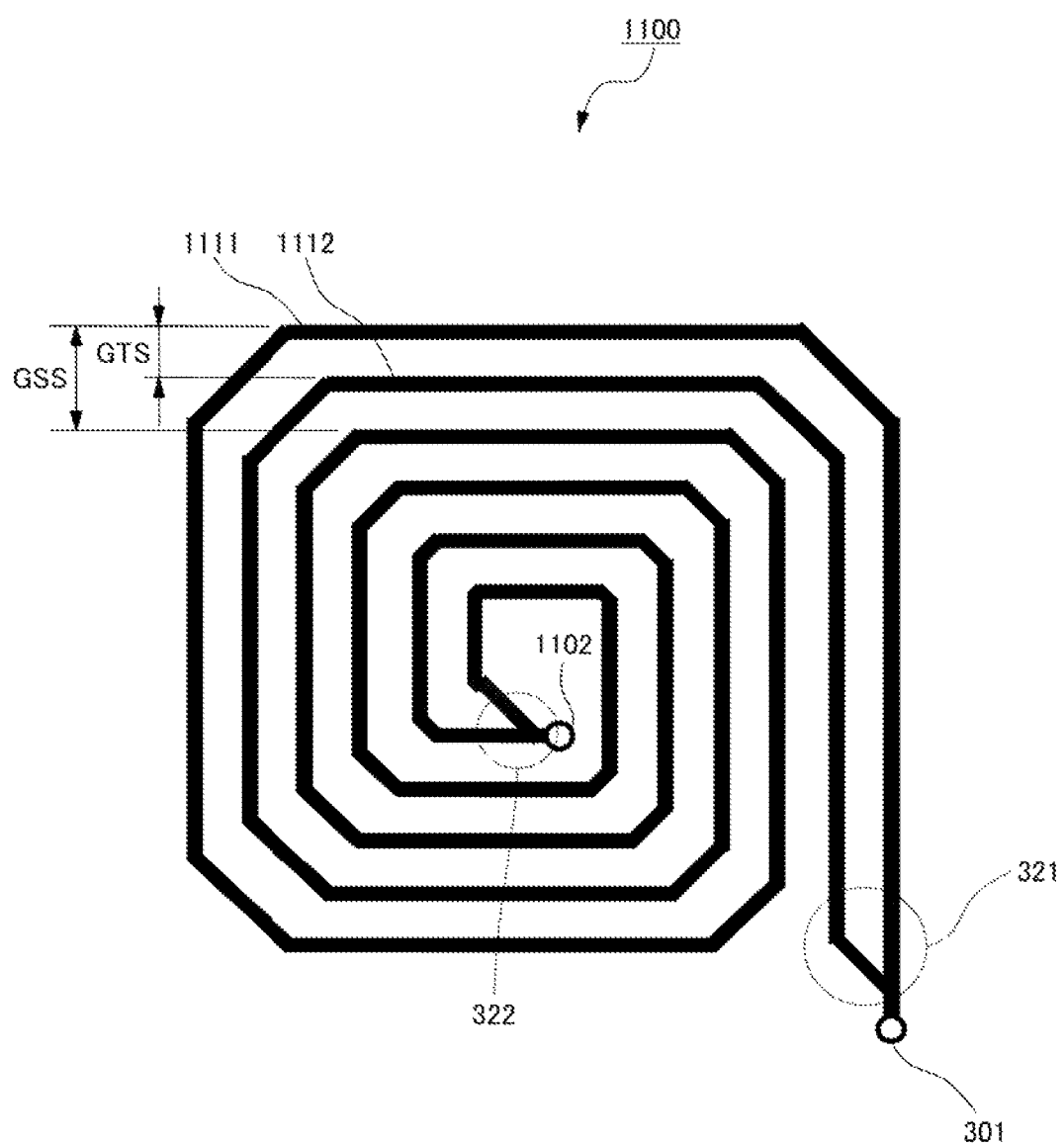
FIG. 11 is a plan view of modification 5 of the coil antenna.

(G) FIG. 11 is a plan view of modification 5 of the coil antenna pertaining to Embodiment 1. Referring to FIG. 11, this coil antenna 1100 has the second terminal 1102. The second terminal is located closer to the center of the coil antenna in the coil antenna 1100 than in the coil antenna 700 shown in FIG. 7. Other features of the coil antenna 1100 are similar to those of the coil antenna 700 shown in FIG. 7. In particular, each of the first and second antenna elements 1111, 1112, like the first and second antenna elements 711, 712 shown in FIG. 7, is a substantially rectangular spiral having three inward, counterclockwise turns. The first antenna element 1111 is an evenly-spaced spiral, with a plurality of turns at a constant distance from one another, and the first and second antenna elements 1111, 1112 are evenly spaced, with a constant distance GTS therebetween; the distance GTS is half of the distance GSS between adjacent turns of the spiral formed by the first antenna element 1111. Since the distance between wiring lines is constant throughout the antenna elements 1111, 1112, magnetic fields caused by electric currents flowing through the wiring lines are disturbed only to a small extent at any of the four corners CRN of the spirals. This suppresses signal losses, and thus enables the coil antenna 1100 to achieve a sufficiently high gain. Since the wiring lines are spaced a larger distance apart than the wiring lines shown in FIG. 7, an electric current flowing at a given portion of the antenna elements 1111, 1112 is hardly affected by electric currents flowing at other portions of the antenna elements 1111, 1112. This suppresses signal distortions, and thus enables the coil antenna 1100 to achieve sufficiently high performances. In addition, the uniform magnetic fields generated by the coil antenna 1100 disposed on a chip covers a larger region than the uniform magnetic fields generated by the coil antenna 700 shown in FIG. 7 does. This makes it easier to adjust, with respect to the chip in which the coil antenna 1100 is disposed, the location of chip different from the chip on which the coil antenna 1100 is disposed to allow the magnetic fields to penetrate another coil antenna on the different chip. In this sense, the coil antenna 1100 shown in FIG. 11 easily establishes induction coupling with another coil antenna.

Figure 12A:
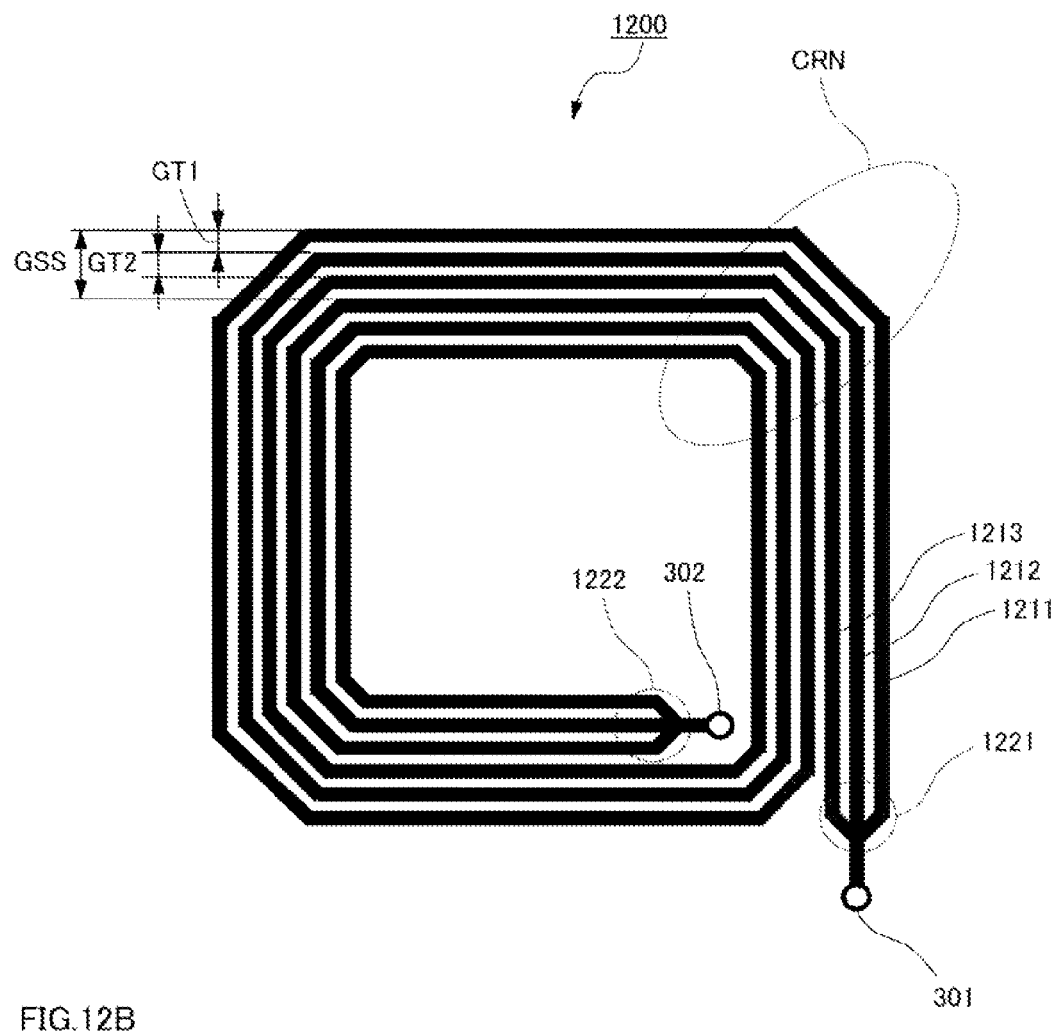
FIG. 12A is a plan view of modification 6 of the coil antenna.

(H) FIG. 12A is a plan view of modification 6 of the coil antenna pertaining to Embodiment 1. Referring to FIG. 12A, this coil antenna 1200 differs from the coil antenna 800 shown in FIG. 8 for having three antenna elements 1211, 1212, 1213 connecting first and second junctions 1221, 1222. Corresponding portions of the loops formed by the three antenna elements 1211, 1212, 1213 run parallel. Other features of the coil antenna 1200 are similar to those of the coil antenna 800 shown in FIG. 8. In particular, the antenna elements 1211, . . . , 1213 are concentric loops. Portions of the second antenna element 1212 run in parallel with, and are located to the inside of corresponding portions of the first antenna element 1211, and portions of the third antenna element 1213 run in parallel with, and are located to the inside of corresponding portions of the second antenna element 1212. Each of the loops is a substantially rectangular spiral having two inward, counterclockwise turns. Since each of the antenna elements 1211, . . . , 1213 has "two" turns, the coil antenna 1200 has "six" turns in total. As a result, the coil antenna 1200 has substantially the same inductance as the coil antenna 800 shown in FIG. 8. On the other hand, the resistance of the coil antenna 1200 is substantially one third of the resistance of each of the antenna elements 1211, . . . , 1213. Since each of the antenna elements 1211, . . . , 1213 is shorter than the antenna elements 711, 712 shown in FIG. 8, the resistance of the coil antenna 1200 is less than two thirds of the resistance of the coil antenna 800 shown in FIG. 8. This enables the coil antenna 1200 to achieve a sufficiently high gain in a high frequency band in the order of gigahertz, especially in a high frequency band of 10 GHz or higher.

Referring further to FIG. 12A, the first antenna element 1211 is an evenly-spaced spiral, with a plurality of turns at a constant distance from one another; the first and second antenna elements 1211, 1212 are evenly spaced, with a constant distance GT1 therebetween, and the second and third antenna elements 1212, 1213 are evenly spaced, with a constant distance GT2 therebetween; the distances GT1, GT2 are one third of the distance GSS between adjacent turns of the spiral formed by the first antenna element 1211. Since the distance between wiring lines is constant throughout the antenna elements 1211-1213, magnetic fields caused by electric currents flowing through the wiring lines are disturbed only to a small extent at any of the four corners CRN of the spirals. In addition, at each of the junctions 1221, 1222, the end portions of the first and third antenna elements 1211, 1213 both meet the end portion of the second antenna element 1212 at the same position of the end portion of the second antenna element 1212 at an oblique angle, e.g., at an angle of 45 degrees. Thus, electric currents flowing through the antenna elements 1211, . . . , 1213 are disturbed by reflection only to a small extent at any of the two junctions 1221, 1222. As a result, signal losses are suppressed, and thus, the coil antenna 1100 can achieve a sufficiently high gain.

Figure 12B:
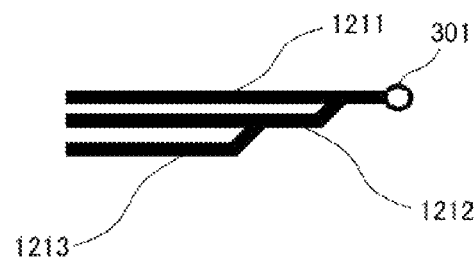
FIG. 12B is an enlarged plan view showing another example of the structure of wiring lines applicable to junctions in the coil antenna shown in FIG. 12A.

FIG. 12B is an enlarged plan view showing another example of the structure of wiring lines applicable to the junctions in the coil antenna shown in FIG. 12A. The junction shown in FIG. 12B differs from the junctions 1221, 1222 shown in FIG. 12A in that: the second antenna element 1212 meets the first antenna element 1211 at an oblique angle, e.g., at an angle of 45 degrees, and at a separate location, the third antenna element 1213 meets the second antenna element 1212 at an oblique angle, e.g., at an angle of 45 degrees. At this junction, electric currents flowing through the antenna elements 1211, . . . , 1213 are disturbed by reflection only to a small extent, which is similar to the situation at the junctions 1221, 1222. As a result, signal losses are suppressed, and thus, the coil antenna 1200 can achieve a sufficiently high gain. In addition, at the junction, the angle of the end portion of the second antenna element 1212 with respect the end portion of the first antenna element 1211 and the angle of the end portion of the third antenna element 1213 with respect to the end portion of the second antenna element 1212 can be separately set. In this way, the three antenna elements 1211, . . . , 1213 can be adjusted to have substantially equal total lengths. When the three antenna elements 1211, . . . , 1213 are adjusted to have equal total lengths, the antenna elements 1211, . . . , 1213 have substantially equal resistance, and thus the coil antenna 1200 can achieve high performances.

Figure 13:
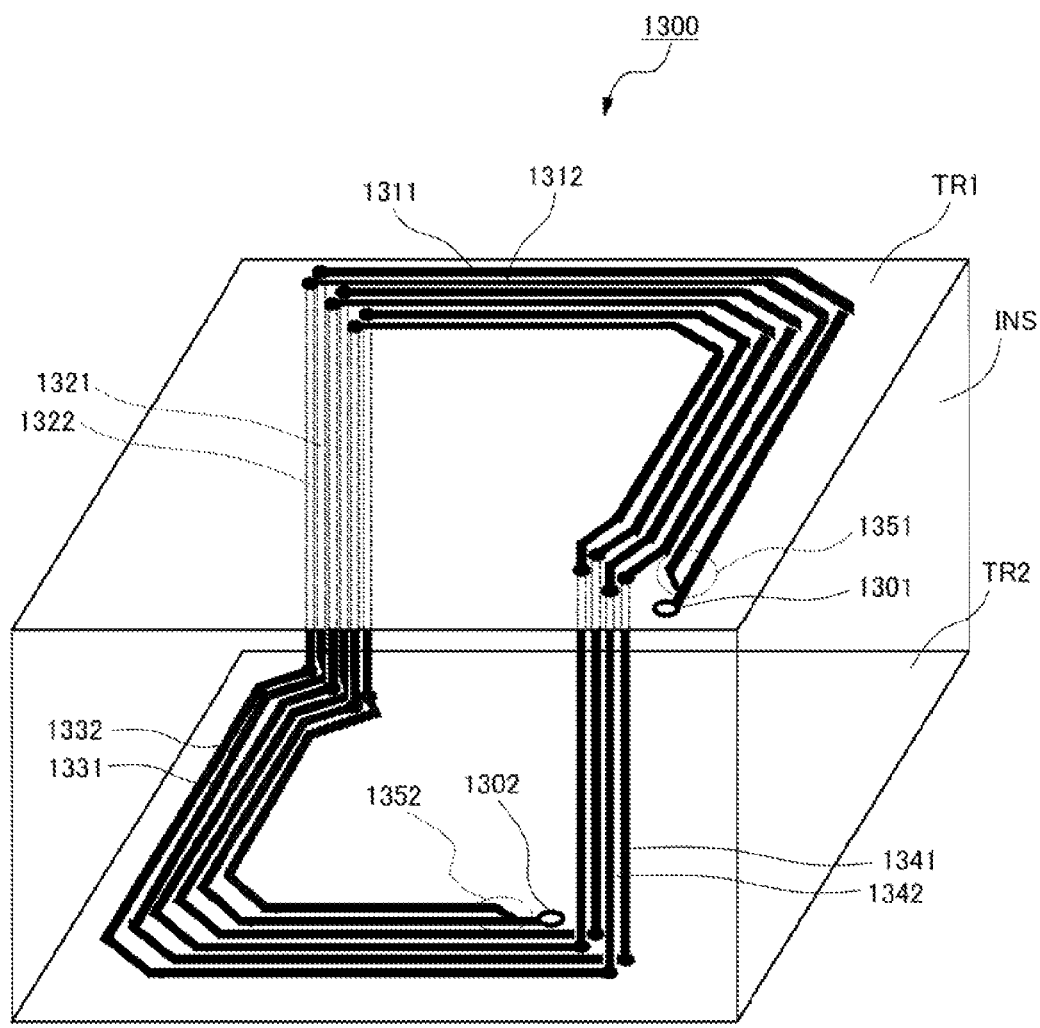
FIG. 13 is a perspective view of modification 7 of the coil antenna.

(I) FIG. 13 is a perspective view of modification 7 of the coil antenna pertaining to Embodiment 1. Referring to FIG. 13, a chip includes a first wiring layer TR1, a second wiring layer TR2, and an interlayer insulator film INS. The two wiring layers TR1, TR2 are separated by the interlayer insulator film INS, and a coil antenna 1300 is composed of a portion in the first wiring layer TR1 and a portion in the second wiring layer TR2. More concretely, this coil antenna 1300 includes: in the first wiring layer TR1, a first terminal 1301, a first half 1311 of a first antenna element, a first half 1312 of a second antenna element, and a first junction 1351; in the second wiring layer TR2, a second terminal 1302, a second half 1331 of the first antenna element, a second half 1332 of the second antenna element, and a second junction 1352; and in the interlayer insulator film INS, four types of vias 1321, 1322, 1341, 1342. The first and second terminals 1301, 1302 are connected to the communication circuit 113 on the same chip, and receive differential signals from the circuit 113. The first half 1311 of the first antenna element on the first wiring layer TR1 is connected through the first and third vias 1321, 1341 to the second half 1331 of the first antenna element on the second wiring layer TR2. The first half 1312 of the second antenna element on the first wiring layer TR1 is connected through the second and fourth vias 1322, 1342 to the second half 1332 of the second antenna element on the second wiring layer TR2. In this manner, the first and second antenna elements form concentric spirals. When viewed from a direction vertical to the surface of the chip, the spirals formed by the antenna elements are substantially rectangular and each have three inward, counterclockwise turns. In the first wiring layer TR1, portions of the first half 1312 of the second antenna element run in parallel with, and are located to the inside of corresponding portions of the first half 1311 of the first antenna element. Conversely, in the second wiring layer TR2, portions of the second half 1331 of the first antenna element run in parallel with, and are located to the inside of corresponding portions of the second half 1332 of the second antenna element. This enables the total lengths of the two antenna elements to be more precisely set to an equal length. At the first junction 1351, respective ends of the first halves 1311, 1312 of the first and second antenna elements meet one another to form a single wiring line connecting to the first terminal 1301. At the second junction 1352, respective ends of the second halves 1331, 1332 of the first and second antenna elements meet one another to form a single wiring line connecting to the second terminal 1302.

To facilitate the visualization of the structure of the coil antenna 1300 in FIG. 13, the scale vertical to the surface of the chip is exaggerated relative to the scale horizontal to the surface of the chip. This means the actual lengths of the vias 1321, 1322, 1341, 1342 are sufficiently smaller than the span of the coil antenna 1300 in the direction parallel to the surface of the chip. Accordingly, both the electric current distortions near the vias 1321, . . . , 1342, and the magnetic fields generated by electric currents flowing through the vias 1321, . . . , 1342 are sufficiently small. The coil antenna 1300 thus generates the strongest magnetic field in the direction along the line normal to the chip, and can accordingly establish sufficiently strong inductive coupling to other coil antennas located straight above and below.

Figure 14:
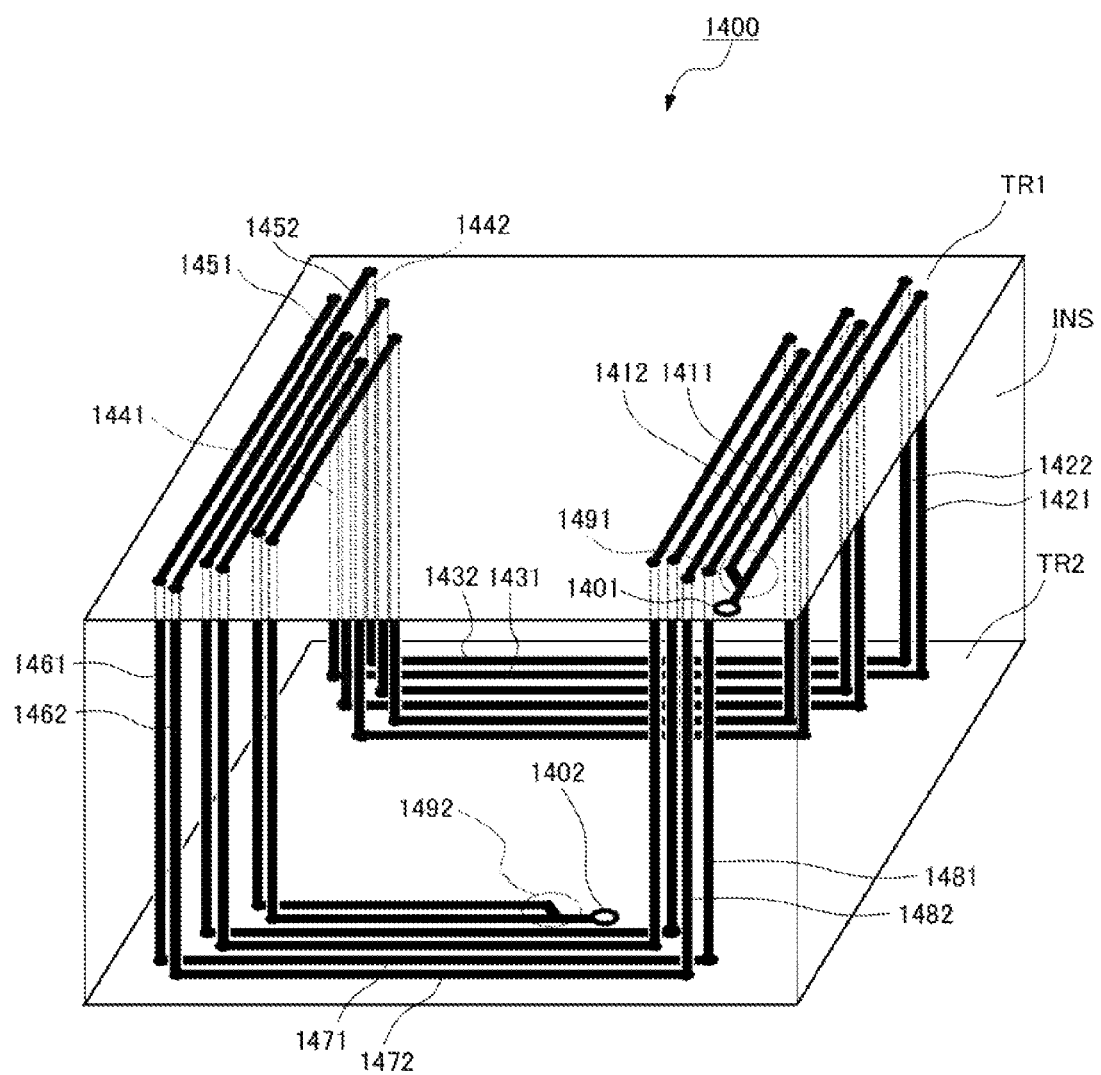
FIG. 14 is a perspective view of modification 8 of the coil antenna.

(J) FIG. 14 is a perspective view of modification 8 of the coil antenna pertaining to Embodiment 1. Referring to FIG. 14, a chip includes a first wiring layer TR1, a second wiring layer TR2, and an interlayer insulator film INS, like the chip shown in FIG. 13. A coil antenna 1400 is composed of a portion in the first wiring layer TR1 and a portion in the second wiring layer TR2. More concretely, this coil antenna 1400 includes: in the first wiring layer TR1, a first terminal 1401, a first portion 1411 and a third portion 1451 of a first antenna element, a first portion 1412 and a third portion 1452 of a second antenna element, and a first junction 1491; in the second wiring layer TR2, a second terminal 1402, a second portion 1431 and a fourth portion 1471 of the first antenna element, a second portion 1432 and a fourth portion 1472 of the second antenna element, and a second junction 1492; and in the interlayer insulator film INS, eight types of vias 1421, 1422, 1441, 1442, 1461, 1462, 1481, 1482. The first and second terminals 1401, 1402 are connected to the communication circuit 113 on the same chip, and receive differential signals from the circuit 113. The first portion 1411 of the first antenna element is connected through the first via 1421 to the second portion 1431 of the first antenna element; the second portion 1431 is connected through the third via 1441 to the third portion 1451 of the first antenna element; the third portion 1451 is connected through the fifth via 1461 to the fourth portion 1471 of the first antenna element; and the fourth portion 1471 is connected through the seventh via 1481 to the first portion 1411 of the first antenna element. The first portion 1412 of the second antenna element is connected through the second via 1422 to the second portion 1432 of the second antenna element; the second portion 1432 is connected through the fourth via 1442 to the third portion 1452 of the second antenna element; the third portion 1452 is connected through the sixth via 1462 to the fourth portion 1472 of the second antenna element; and the fourth portion 1472 is connected through the eighth via 1482 to the first portion 1412 of the second antenna element. In this manner, the first and second antenna elements form concentric spirals. When viewed from a direction vertical to the surface of the chip, the spirals formed by the antenna elements are substantially rectangular and each have three inward, counterclockwise turns. In the first wiring layer TR1, portions of the first portion 1412 of the second antenna element run in parallel with, and are located to the inside of corresponding portions of the first portion 1411 of the first antenna element, and portions of the third portion 1452 of the second antenna element run in parallel with, and are located to the inside of corresponding portions of the third portion 1451 of the first antenna element. In the second wiring layer TR2, portions of the second portion 1431 of the first antenna element run in parallel with, and are located to the inside of corresponding portions of the second portion 1432 of the second antenna element, and portions of the fourth portion 1471 of the first antenna element run in parallel with, and are located to the inside of corresponding portions of the fourth portion 1472 of the second antenna element. This structure enables the total lengths of the two antenna elements to be more precisely set to an equal length. At the first junction 1491, respective ends of the first portions 1411, 1412 of the first and second antenna elements meet one another to form a single wiring line connecting to the first terminal 1401. At the second junction 1492, respective ends of the fourth portions 1471, 1472 of the first and second antenna elements meet one another to form a single wiring line connecting to the second terminal 1402.

In FIG. 14, in a similar manner to that in FIG. 13, the scale vertical to the surface of the chip is exaggerated relative to the scale horizontal to the surface of the chip. This means the actual lengths of the vias 1421, ..., 1482 are sufficiently smaller than the span of the coil antenna 1400 in the direction parallel to the surface of the chip. The coil antenna 1400, like the coil antenna 1300 shown in FIG. 13, can thus establish sufficiently strong inductive coupling to other coil antennas located straight above and below.

Figure 15:
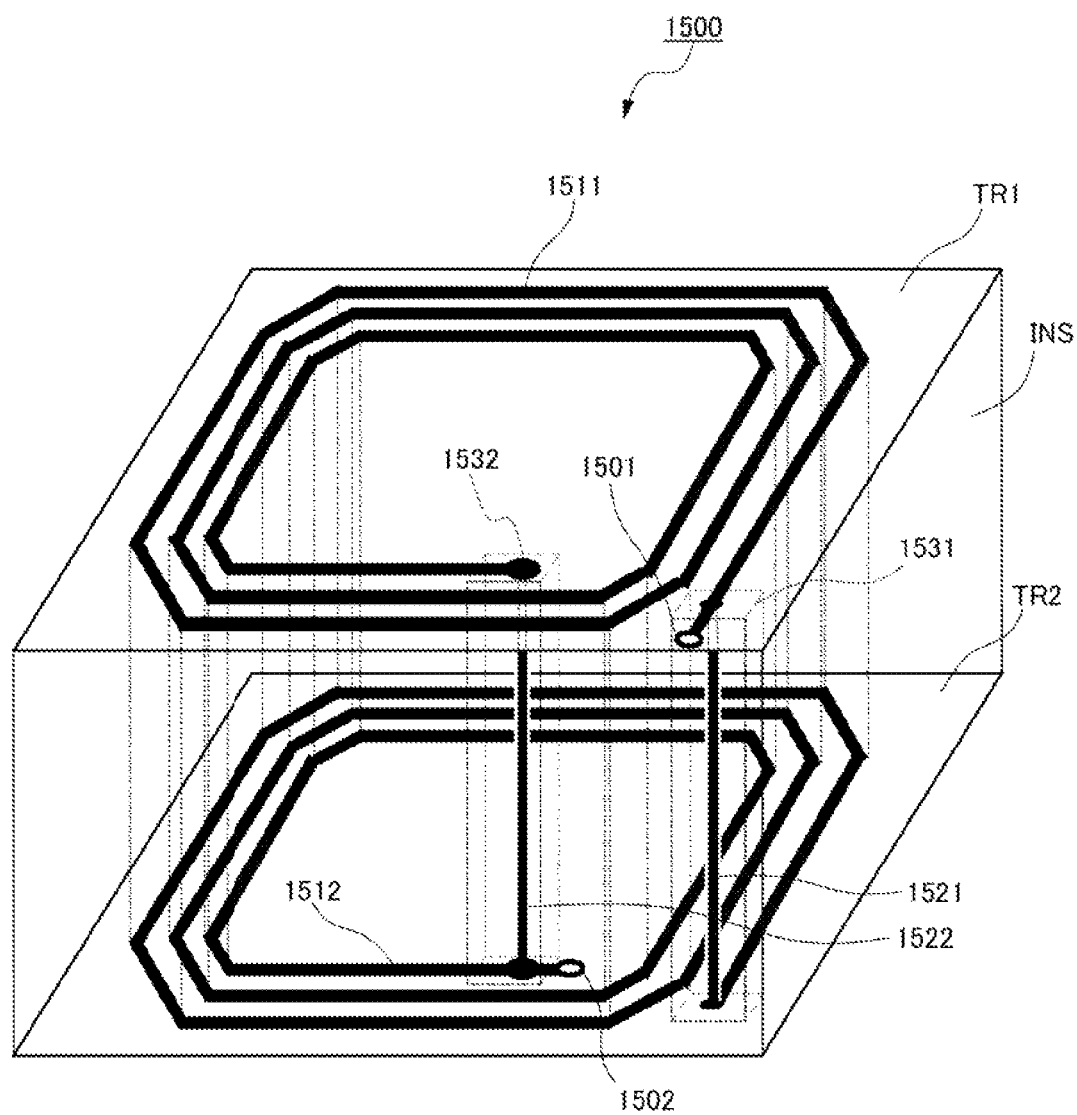
FIG. 15 is a perspective view of modification 9 of the coil antenna.

(K) FIG. 15 is a perspective view of modification 9 of the coil antenna pertaining to Embodiment 1. Referring to FIG. 15, a chip includes a first wiring layer TR1, a second wiring layer TR2, and an interlayer insulator film INS, like the chip shown in FIG. 13. A coil antenna 1500 is composed of a portion in the first wiring layer TR1 and a portion in the second wiring layer TR2. More concretely, this coil antenna 1500 includes: in the first wiring layer TR1, a first terminal 1501 and a first antenna element 1511; in the second wiring layer TR2, a second terminal 1502 and a second antenna element 1512; and in the interlayer insulator film INS, two vias 1521, 1522. The first and second terminals 1501, 1502 are connected to the communication circuit 113 on the same chip, and receive differential signals from the circuit 113. The size and the shapes of the loops of the first and second antenna elements 1511, 1512 are quite the same, with the difference between sizes and loop shapes being within an acceptable error range in the forming of wiring lines. The first and second antenna elements 1511, 1512 are preferably arranged such that, when they are viewed from a direction vertical to the surface of the chip, their images completely overlap one another. The loop of each of the first and second antenna elements 1511, 1512 has the shape of a substantially rectangular spiral having three inward, counterclockwise turns. In particular, the two antenna elements 1511, 1512 have substantially equal total lengths. The first via 1521 connects respective first ends of the first and second antenna elements 1511, 1512. The first via 1521 and the first ends of the first and second antenna elements 1511, 1512 connected thereby form the first junction 1531, which is connected with the first terminal 1501. The second via 1522 connects respective second ends of the first and second antenna elements 1511, 1512. The second via 1522 and the second ends of the first and second antenna elements 1511, 1512 connected thereby form the second junction 1532, which is connected with the second terminal 1502.

In FIG. 15, in a similar manner to that in FIG. 13, the scale vertical to the surface of the chip is exaggerated relative to the scale horizontal to the surface of the chip. This means the actual lengths of the vias 1521, 1522 are sufficiently smaller than the sizes of the antenna elements 1511, 1512. The coil antenna 1500, like the coil antenna 1300 shown in FIG. 13, can thus establish sufficiently strong inductive coupling to other coil antennas located straight above and below.

Embodiment 2

Figure 16:
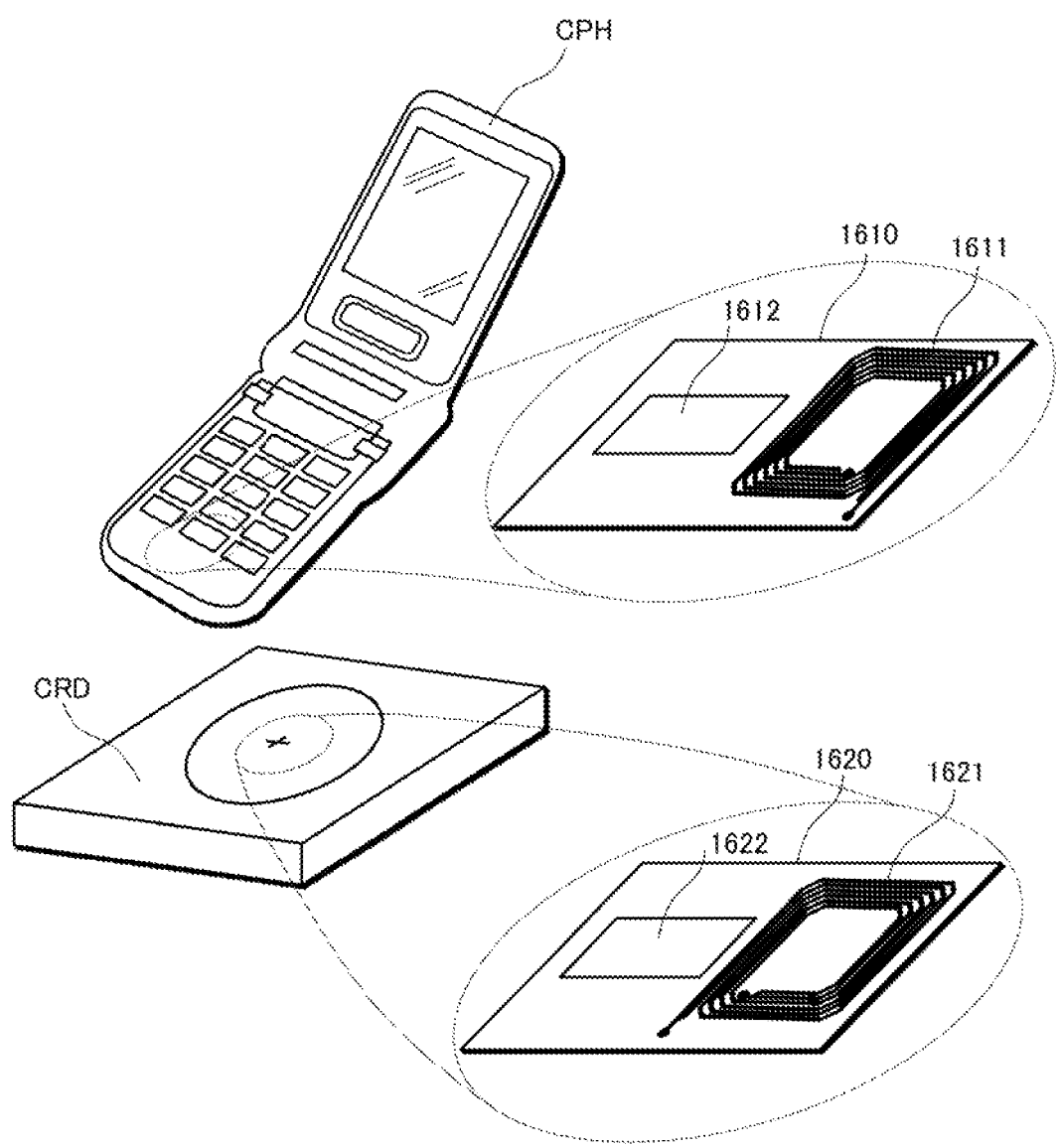
FIG. 16 is a schematic view of a contactless communication system according to Embodiment 2 of the present invention.

FIG. 16 is a schematic view of a contactless communication system according to Embodiment 2 of the present invention. Referring to FIG. 16, this system includes a first chip 1610 built in a cellular phone CPH and a second chip 1620 built in a cradle CRD. This system is used for data exchange between the cellular phone CPH and the cradle CRD.

The first chip 1610 is located near a surface of the body of the cellular phone CPH, and includes a first coil antenna 1611 and a first transceiver circuit 1612. The first coil antenna 1611 consists of wiring lines on the first chip 1610. The first coil antenna 1611 is connected via a wiring layer of the first chip 1610 (not shown in FIG. 16) with the first transceiver circuit 1612. The first coil antenna 1611 has a shape similar to that of the coil antenna 300 shown in FIG. 3, and in particular, has two antenna elements running parallel between ends of the first coil antenna 1611. The two antenna elements form concentric spirals. The first transceiver circuit 1612 includes components similar to those of the transmitter and receiver circuits 511, 521 shown in FIG. 5, and by using such components, converts parallel data received from a CPU or the like into a differential signal and transmits the signal to the first coil antenna 1611, and conversely, converts a differential signal detected by the first coil antenna 1611 into parallel data and transmits the data to the CPU or the like.

The cradle CRD is externally or internally connected with an information device such as a personal computer, and the top surface of its body includes a portion on which the cellular phone CPH can be placed. The second chip 1620 is located near the surface of the portion, and includes a second coil antenna 1621 and a second transceiver circuit 1622. The second coil antenna 1621 consists of wiring lines on the second chip 1620. The second coil antenna 1621 is connected via a wiring layer of the second chip 1620 (not shown in FIG. 16) with the second transceiver circuit 1622. The second coil antenna 1621 has a shape similar to that of the coil antenna 400 shown in FIG. 4, and in particular, has two antenna elements running parallel between ends of the second coil antenna 1621. The two antenna elements form concentric spirals. When the cellular phone CPH is properly placed on the top surface of the cradle CRD, the first coil antenna 1611 is positioned straight above and concentric with the second coil antenna 1621. This establishes induction coupling between the coil antennas 1611, 1621, which allows differential signals to be transmitted therebetween. The second transceiver circuit 1622 includes components similar to those of the transmitter and receiver circuits 511, 521 shown in FIG. 5, and by using such components, converts parallel data received from the information device into a differential signal and transmits the signal to the second coil antenna 1621, and conversely, converts a differential signal detected by the second coil antenna 1621 into parallel data and transmits the data to a CPU or the like. As a result, the information device can exchange data with the cellular phone CPH via the cradle CRD.

As shown in FIG. 16, the contactless communication system according to Embodiment 2 of the present invention has coil antennas that are similar to the coil antennas 300, 400 shown in FIGS. 3, 4. That is, the coil antennas 1611, 1621 are separately formed on the two chips 1610, 1620, respectively, and each include two antenna elements. In each of the coil antennas 1611, 1621, the two antenna elements run parallel between ends coil antenna, and form concentric spirals. This enables the coil antennas 1611, 1621, even though their wiring lines have a constant width limited by a design rule, to achieve sufficiently low resistances while maintaining high inductances. As a result, the contactless communication system according to Embodiment 2 of the present invention can maintain high intensities of signals for contactless communication between the chips 1610, 1620 in a high frequency band in the order of gigahertz, especially in a high frequency band of 10 GHz or higher, thus enhancing the reliability.

The contactless communication system according to Embodiment 2 of the present invention is not limited to being used for data exchange between the cellular phone CPH and the cradle CRD. That is, the contactless communication system according to Embodiment 2 of the present invention may be used for data exchange between the cradle CRD and a mobile device such as a portable game machine, a controller of a video game machine, a personal digital assistance, or a digital camera. Alternatively, the system may be used for data exchange between different mobile devices or between an IC card and card reader.

Additional Statement

The invention may, based on the above-described embodiments, be characterized as follows:

In the antenna according to one aspect of the present invention, each of the at least two antenna elements may have a shape of a loop, the loops formed by the at least two antenna elements being concentric, corresponding portions of the loops running parallel on the chip. This enables the antenna according to one aspect of the present invention to achieve a sufficiently low resistance while maintaining a high inductance.

In the antenna according to one aspect of the present invention, each of the loops may be substantially rectangular and may have at least two bends per corner, the bends each having an internal angle larger than 90 degrees. In this case, electric currents flowing through the antenna elements are disturbed by reflection only to a small extent at any of the corners. This suppresses signal losses especially in a high frequency band.

In the antenna according to one aspect of the present invention, the loops may each be an evenly-spaced spiral, with a plurality of turns at a constant distance from one another. In the antenna according to one aspect of the present invention, the at least two antenna elements may be evenly spaced, with a constant distance between corresponding portions of the loops. In either case, magnetic fields caused by electric currents flowing through the antenna elements are disturbed only to a small extent. This suppresses signal losses.

In the antenna according to one aspect of the present invention, the at least two antenna elements may meet at an angle smaller than 90 degrees at each of the first junction and the second junction. In the antenna according to one aspect of the present invention, one of the at least two antenna elements may extend straight and another one of the at least two antenna elements may meet said one of the at least two antenna elements at an oblique angle at either or both of the first junction and the second junction. In the antenna according to one aspect of the present invention, a separate single wiring line on the chip may meet each of the at least two antenna elements at the same angle at either or both of the first junction and the second junction. In any of these cases, electric currents flowing through the antenna elements are disturbed by reflection only to a small extent at any of the junctions. This suppresses signal losses especially in a high frequency band. In addition, the antenna elements can be adjusted to have substantially equal total lengths by appropriately adjusting the angle between the antenna elements. This enables properly adjusting the inductance and resistance of the antenna at the same time.

In the antenna according to one aspect of the present invention, the chip may include a first wire layer and a second wire layer, and the at least two antenna elements may each include a first portion, a second portion, and at least two vias. The first portion belongs to the first wire layer; the second portion belongs to the second wire layer; and the at least two vias connect the first portion and the second portion. Alternatively, in the antenna according to one aspect of the present invention, the chip may include a first wire layer and a second wire layer, one of at least two antenna elements may belong to the first wiring layer and another one of the at least two antenna elements may belong to the second wiring layer, and the first junction and the second junction may each include a via connecting the first wiring layer and the second wire layer. In either case, the lengths of the antenna elements can be more precisely set to an equal length, This facilitates properly adjusting the inductance and resistance of the antenna at the same time.

A transmitter device according to one aspect of the present invention includes a transmitter circuit and a transmitting antenna. The transmitter circuit converts parallel data into a differential signal. The transmitting antenna is located on a chip and transmits the differential signal to another chip. The transmitting antenna includes at least two antenna elements, a first terminal, a second terminal, a first junction, and a second junction. The at least two antenna elements each consist of a wiring line on the chip. The first terminal and the second terminal are connected with the transmitter circuit. At the first junction, respective first ends of the at least two antenna elements meet one another to form a single wiring line connecting to the first terminal. At the second junction, respective second ends of the at least two antenna elements meet one another to form a single wiring line connecting to the second terminal.

In the transmitter device according to one aspect of the present invention, the at least two antenna elements connect the first and second junctions. This enables the resistance between the junctions to be sufficiently low, even though wiring lines constituting the antenna elements have a limited width. Further, while maintaining the low resistance, the antenna elements can also be provided with sufficiently long lengths. As a result, the above-mentioned transmitter circuit can maintain high intensities of signals in a high frequency band, thus enhancing the reliability.

A receiver device according to one aspect of the present invention includes a receiving antenna and a receiver circuit. The receiving antenna is located on a chip and receives a differential signal from another chip. The receiver circuit converts the differential signal into parallel data. The receiving antenna includes at least two antenna elements, a first terminal, a second terminal, a first junction, and a second junction. The at least two antenna elements each consist of a wiring line on the chip. The first terminal and the second terminal are connected with the receiver circuit. At the first junction, respective first ends of the at least two antenna elements meet one another to form a single wiring line connecting to the first terminal. At the second junction, respective second ends of the at least two antenna elements meet one another to form a single wiring line connecting to the second terminal.

In the receiver device according to one aspect of the present invention, the at least two antenna elements connect the first and second junctions. This enables the resistance between the junctions to be sufficiently low, even though wiring lines constituting the antenna elements have a limited width. Further, while maintaining the low resistance, the antenna elements can also be provided with sufficiently long lengths. As a result, the above-mentioned receiver circuit can maintain high receiving sensitivity in a high frequency band, thus enhancing the reliability.

A three-dimensional integrated circuit according to one aspect of the present invention includes a first chip and a second chip stacked one on top of the other; the first chip includes a transmitter circuit and a transmitting antenna; and the second chip includes a receiving antenna and a receiver circuit. The transmitter circuit converts parallel data into a differential signal. The transmitting antenna transmits the differential signal to the second chip. The receiving antenna receives the differential signal from the transmitting antenna. The receiver circuit converts the differential signal into the parallel data. The transmitting antenna includes a first antenna element, a second antenna element, a first terminal, a second terminal, a first junction, and a second junction. The first and second antenna elements each consist of a wiring line on the first chip. The first terminal and the second terminal are connected with the transmitter circuit. At the first junction, respective first ends of the at least two antenna elements meet one another to form a single wiring line connecting to the first terminal. At the second junction, respective second ends of the at least two antenna elements meet one another to form a single wiring line connecting to the second terminal. The receiving antenna includes a third antenna element, a fourth antenna element, a third terminal, a fourth terminal, a third junction, and a fourth junction. The third and fourth antenna elements each consist of a wiring line on the second chip. The third terminal and the fourth terminal are connected with the receiver circuit. At the third junction, respective first ends of the third antenna element and the fourth antenna element meet one another to form a single wiring line connecting to the third terminal. At the fourth junction, respective second ends of the third antenna element and the fourth antenna element meet one another to form a single wiring line connecting to the fourth terminal.

The three-dimensional integrated circuit pertaining to one aspect of the present invention uses the transmitting and receiving antennas for contactless communication between the first and second chips. The antennas each have the two antenna elements connecting the two junctions. This enables the antennas, even though their wiring lines have a constant width limited by s design rule, to achieve a sufficiently low resistance while maintaining a high inductance. As a result, the three-dimensional integrated circuit can maintain high intensities of signals for chip-to-chip contactless communication in a high frequency band in the order of gigahertz, especially in a high frequency band of 10 GHz or higher, thus enhancing the reliability.

INDUSTRIAL APPLICABILITY

The present invention relates to a contactless communication system, and as described above, an antenna is configured to include at least two antenna elements running parallel between ends of the antenna. The present invention thus clearly has industrial applicability.

REFERENCE SIGNS LIST

300 coil antenna
301 first terminal
302 second terminal
311 first antenna element
312 second antenna element
321 first junction
322 second junction
CRN corner of a spiral formed by an antenna element
GSC distance between turns of a spiral formed by the first antenna element, at each corner of the spiral
GSS distance between turns of a spiral formed by the first antenna element, along each edge of the spiral
GTC distance between two spirals formed by two antenna elements, at corners of the spirals
GTS distance between two spirals formed by two antenna elements, along edges of the spirals

The invention claimed is:
1. An antenna comprising:
at least two antenna elements on a chip, the at least two antenna elements each consisting of a wiring line on the chip;
a first terminal and a second terminal on the chip, the first terminal and the second terminal connected with a circuit on the chip;
a first junction at which respective first ends of the at least two antenna elements meet one another to form a single wiring line connecting to the first terminal; and
a second junction at which respective second ends of the at least two antenna elements meet one another to form a single wiring line connecting to the second terminal.
2. The antenna according to claim 1, wherein
the at least two antenna elements have substantially equal total length.
3. The antenna according to claim 1, wherein
each of the at least two antenna elements has a shape of a loop, the loops formed by the at least two antenna elements being concentric, corresponding portions of the loops running parallel on the chip.
4. The antenna according to claim 3, wherein
each of the loops is substantially rectangular and has at least two bends per corner, the bends each having an internal angle larger than 90 degrees.

5. The antenna according to claim 3, wherein
the loops are each an evenly-spaced spiral, with a plurality of turns at a constant distance from one another.

6. The antenna according to claim 3, wherein
the at least two antenna elements are evenly spaced, with a constant distance between corresponding portions of the loops.

7. The antenna according to claim 1, wherein
the at least two antenna elements meet at an angle smaller than 90 degrees at each of the first junction and the second junction.

8. The antenna according to claim 1, wherein
one of the at least two antenna elements extends straight and another one of the at least two antenna elements meets said one of the at least two antenna elements at an oblique angle at either or both of the first junction and the second junction.

9. The antenna according to claim 1, wherein
a separate single wiring line on the chip meets each of the at least two antenna elements at the same angle at either or both of the first junction and the second junction.

10. The antenna according to claim 1, wherein
the chip includes a first wiring layer and a second wiring layer, and
the at least two antenna elements each include:
 a first portion belonging to the first wiring layer;
 a second portion belonging to the second wiring layer; and
 at least two vias connecting the first portion and the second portion.

11. The antenna according to claim 1, wherein
the chip includes a first wiring layer and a second wiring layer,
one of the at least two antenna elements belongs to the first wiring layer and another one of the at least two antenna elements belongs to the second wiring layer, and
the first junction and the second junction each include a via connecting the first wiring layer and the second wiring layer.

12. A transmitter device comprising:
a transmitter circuit configured to convert parallel data into a differential signal; and
a transmitting antenna located on a chip and configured to transmit the differential signal to another chip,
the transmitting antenna including:
 at least two antenna elements each consisting of a wiring line on the chip;
 a first terminal and a second terminal connected with the transmitter circuit;
 a first junction at which respective first ends of the at least two antenna elements meet one another to form a single wiring line connecting to the first terminal; and
 a second junction at which respective second ends of the at least two antenna elements meet one another to form a single wiring line connecting to the second terminal.

13. A receiver device comprising:
a receiving antenna located on a chip and configured to receive a differential signal from another chip; and
a receiver circuit configured to convert the differential signal into parallel data,
the receiving antenna including:
 at least two antenna elements each consisting of a wiring line on the chip;
 a first terminal and a second terminal connected with the receiver circuit;
 a first junction at which respective first ends of the at least two antenna elements meet one another to form a single wiring line connecting to the first terminal; and
 a second junction at which respective second ends of the at least two antenna elements meet one another to form a single wiring line connecting to the second terminal.

14. A three-dimensional integrated circuit comprising a first chip and a second chip stacked one on top of the other,
the first chip having thereon:
 a transmitter circuit configured to convert parallel data into a differential signal; and
 a transmitting antenna configured to transmit the differential signal to the second chip,
the second chip having thereon:
 a receiving antenna configured to receive the differential signal from the transmitting antenna; and
 a receiver circuit configured to convert the differential signal into the parallel data,
the transmitting antenna including:
 a first antenna element and a second antenna element each consisting of a wiring line on the first chip;
 a first terminal and a second terminal connected with the transmitter circuit;
 a first junction at which respective first ends of the first antenna element and the second antenna element meet one another to form a single wiring line connecting to the first terminal; and
 a second junction at which respective second ends of the first antenna element and the second antenna element meet one another to form a single wiring line connecting to the second terminal,
the receiving antenna including:
 a third antenna element and a fourth antenna element each consisting of a wiring line on the second chip;
 a third terminal and a fourth terminal connected with the receiver circuit;
 a third junction at which respective first ends of the third antenna element and the fourth antenna element meet one another to form a single wiring line connecting to the third terminal; and
 a fourth junction at which respective second ends of the third antenna element and the fourth antenna element meet one another to form a single wiring line connecting to the fourth terminal.

15. A contactless communication system comprising a device with a first chip and a device with a second chip, to realize contactless communication between the devices,
the first chip including:
 a transmitter circuit configured to convert parallel data into a differential signal; and
 a transmitting antenna configured to transmit the differential signal to the second chip,
the second chip including:
 a receiving antenna configured to receive the differential signal from the transmitting antenna; and
 a receiver circuit configured to convert the differential signal into the parallel data,
the transmitting antenna including:
 a first antenna element and a second antenna element each consisting of a wiring line on the first chip;
 a first terminal and a second terminal connected with the transmitter circuit;

a first junction at which respective first ends of the first antenna element and the second antenna element meet one another to form a single wiring line connecting to the first terminal; and a second junction at which respective second ends of the first antenna element and the second antenna element meet one another to form a single wiring line connecting to the second terminal, the receiving antenna including:

a third antenna element and a fourth antenna element each consisting of a wiring line on the second chip;

a third terminal and a fourth terminal connected with the receiver circuit;

a third junction at which respective first ends of the third antenna element and the fourth antenna element meet one another to form a single wiring line connecting to the third terminal; and a fourth junction at which respective second ends of the third antenna element and the fourth antenna element meet one another to form a single wiring line connecting to the fourth terminal.

* * * * *